United States Patent [19]
Furukawa et al.

[11] Patent Number: 5,937,936
[45] Date of Patent: Aug. 17, 1999

[54] HEAT SINK FOR PORTABLE ELECTRONIC DEVICES

[75] Inventors: Yuichi Furukawa, Oyama; Mitsugu Sumitani, Hikone; Tomio Ito, Oyama, all of Japan

[73] Assignee: Showa Aluminum Corporation, Osaka, Japan

[21] Appl. No.: 08/921,256

[22] Filed: Aug. 29, 1997

[30] Foreign Application Priority Data

Sep. 29, 1996 [JP] Japan ................................. 8-227932

[51] Int. Cl.⁶ .................................................. F28D 15/00
[52] U.S. Cl. ............................. 165/104.33; 165/104.26; 361/700; 257/715; 174/15.2
[58] Field of Search ....................... 165/104.33, 104.26; 361/700; 257/715; 174/15.2

[56] References Cited

U.S. PATENT DOCUMENTS

| | | | |
|---|---|---|---|
| 5,199,165 | 4/1993 | Crawford et al. | 165/104.33 |
| 5,355,942 | 10/1994 | Conte | 165/104.33 |
| 5,441,102 | 8/1995 | Burward-Hoy | 165/104.33 |
| 5,490,558 | 2/1996 | Akachi | 165/104.33 |
| 5,495,889 | 3/1996 | Dubelloy | 165/104.33 |
| 5,697,428 | 12/1997 | Akachi | 165/104.33 |
| 5,725,049 | 3/1998 | Swanson et al. | 165/104.26 |
| 5,769,154 | 6/1998 | Adkins et al. | 165/104.26 |

FOREIGN PATENT DOCUMENTS

| | | | |
|---|---|---|---|
| 1 284 506 | 12/1968 | Germany | 165/104.33 |
| 55-65891 | 5/1980 | Japan | 165/104.33 |
| 55-87466 | 7/1980 | Japan | 165/104.33 |
| 55-143390 | 11/1980 | Japan | 165/104.33 |

*Primary Examiner*—Ira S. Lazarus
*Assistant Examiner*—Terrell McKinnon
*Attorney, Agent, or Firm*—Armstrong, Westerman, Hattori, McLeland and Naughton

[57] ABSTRACT

A heat sink for use in a portable electronic device for disposing of the heat generated by an electronic component of the device, the heat sink comprising in its entirety a metal clad plate composed of two metal sheets and having a nonbonded portion in a required pattern, the nonbonded portion providing a heat pipe portion formed by outwardly inflating at least one of the two metal sheets of the nonbonded portion to make a hollow portion and enclosing a working liquid in the hollow portion, the metal clad plate having on one surface thereof a mount portion for the electronic component at a region thereof where the heat pipe portion is partly present, the heat pipe portion having a heat receiving portion at the region thereof where the mount portion is present. When a heat-generating electronic component is attached to the mount portion, the working liquid in the heat receiving portion is heated with the heat produced by the component to evaporate. The resulting gas flows toward other portion, where the gas releases heat through the clad plate and liquefies. The working liquid thus liquefied again returns to the heat receiving portion. The liquid remaining at locations other than the heat receiving portion flows into the heat receiving portion. This operation is repeated to dispose of the heat produced by the component.

2 Claims, 20 Drawing Sheets

HEAT SINK FOR PORTABLE ELECTRONIC DEVICES

BACKGROUND OF THE INVENTION

The present invention relates to host sinks for use in portable electronic devices for disposing of the heat generated by an electronic component of the device.

The term "aluminum" as used herein includes pure aluminum and aluminum alloys.

With portable electronic devices including, for example, notebook personal computers, laptop personal computers and other portable computing devices, it is necessary to remove the heat generated by electronic components such as microprocessor unit (MPU).

For example, notebook personal computers generally comprise a thin housing having a keyboard, and a display device which is free to open or close relative to the housing, Arranged in the housing are an MPU and an aluminum or like metal plate disposed below the keyboard and serving as an electromagnetic shield.

U.S. Pat. No. 5,513,070 discloses the following structure for removing heat from the MPU for use in such notebook computers. A circuit board provided with an MPU on its underside is formed with heat channels extending from the underside to its upper side. The MPU is thermally connected by the heat channels to an aluminum block mounted on the upper side of the circuit board. A tubular heat pipe has one end attached to the aluminum block and the other end connected to a metal plate disposed below the keyboard and serving as an electromagnetic shield. The heat generated by the MPU is transferred through the heat channels to the aluminum block and further through the heat pipe to the metal plate, and released from this plate.

It is strongly desired that notebook computers and like portable electronic devices be compacted and have reduced weight since they are intended chiefly for portability. However, the heat sink structure described requires the aluminum block and tubular heat pipe, is therefore relatively bulky and heavy, and has the problem that the electronic device can not be made more compact and less heavy in its entirety. The heat generated by the MPU is transferred to the working liquid by way of the heat channels, aluminum block and tubular wall of the heat pipe, so that the disclosed structure has another problem of failing to effect efficient heat transfer from the MPU to the working liquid and being low in heat disposal effect.

SUMMARY OF THE INVENTION

An object of the present invention is to provide a heat sink which is free of the foregoing problems for use in portable electronic devices.

Other objects of the invention will be readily understood as the description proceeds.

The present invention provides a heat sink for use in a portable electronic device for disposing of the heat generated by an electronic component of the device, the heat sink comprising in its entirety a metal clad plate composed of two metal sheets and having a nonbonded portion in a required pattern, the nonbonded portion providing a heat pipe portion formed by outwardly inflating at least one of the two metal shoots of the nonbonded portion to make a hollow portion and enclosing a working liquid in the hollow portion, the metal clad plate having on one surface thereof a mount portion for the electronic component at a region thereof where the heat pipe portion is partly present, the heat pipe portion having a heat receiving portion at the region thereof whore the mount portion in present.

When the heat sink is incorporated into a portable electronic device such as notebook personal computer, with a heat-generating electronic component such as MPU attached to the mount portion, the working liquid in the heat receiving portion is heated with the heat produced by the component and evaporates. The resulting gas flows toward other portion, whore the gas releases heat through the clad plate and liquefies. The working liquid thus liquefied again returns to the heat receiving portion. The liquid remaining at locations other than the heat receiving portion flows into the heat receiving portion. This operation is repeated to dispose of the heat generated by the component. Since the heat generated by the electronic component is transferred to the working liquid in the heat receiving portion of the heat pipe portion only through the metal sheets of the clad plate, the heat sink effects efficient heat transfer from the component to the working liquid to produce an improved heat disposal effect.

When the heat sink is incorporated into the portable electronic device, the metal clad plate functions as an electromagnetic shield, consequently eliminating the need to provide another metal plate. Moreover, there is no need to use an aluminum block since the electronic component can be attached directly to the mount portion. Accordingly, the notebook computer having the conventional heat sink structure described can be made more compact and reduced in weight if incorporating the heat sink of the invention.

The present invention will be described below in greater detail with reference to the accompanying drawings.

DESCRIPTION OF THE PREFERRED EMBODIMENTS

Figure 1:
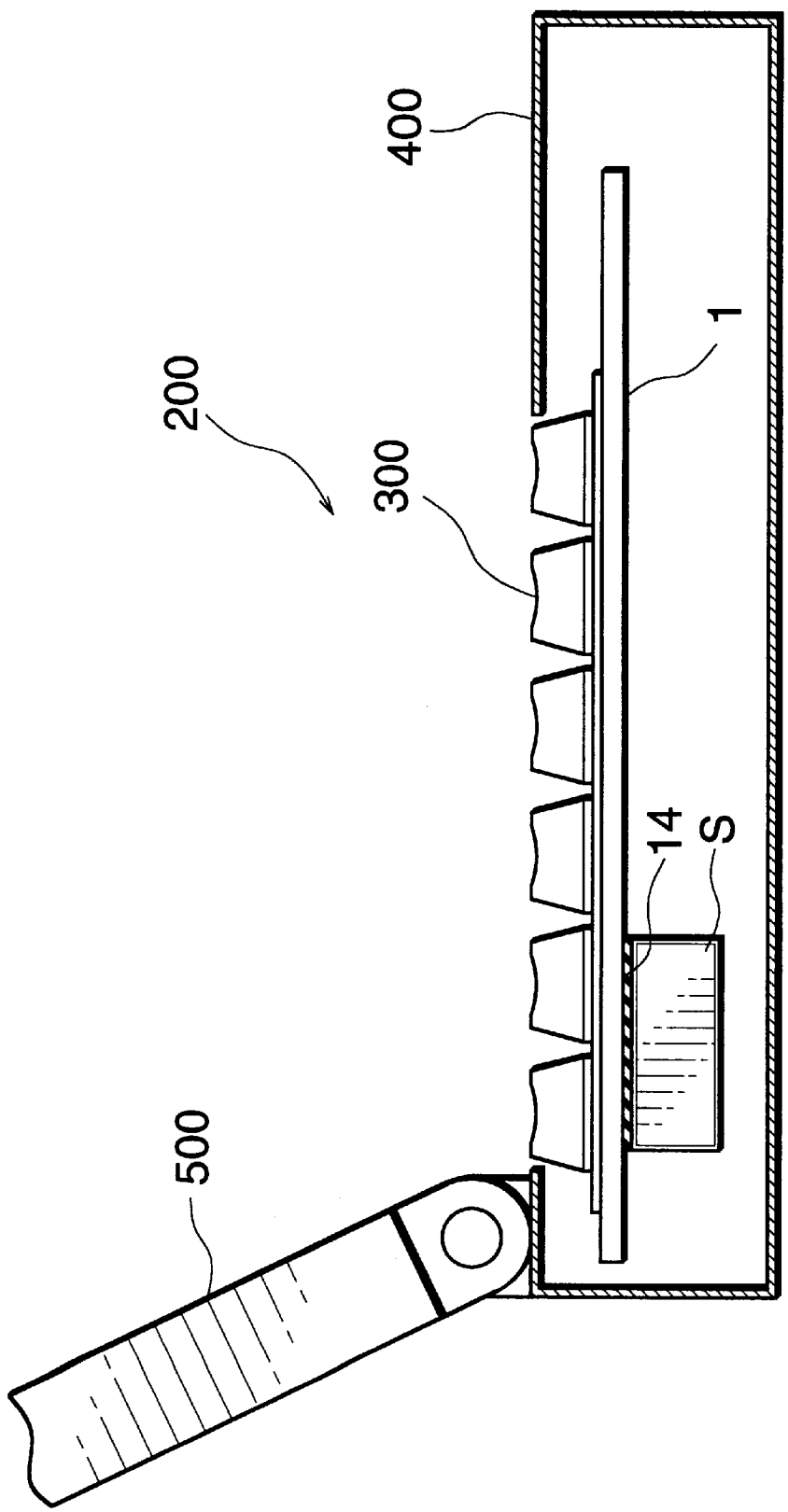
FIG. 1 is a side elevation in section partly broken away and schematically showing a notebook personal computer wherein a first embodiment of heat sink of the invention is incorporated.

Throughout the drawings, like parts are designated by like reference numerals and will not be described repeatedly.

FIGS. 1 to 6 show a first embodiment of heat sink according to the invention.

Figure 10:
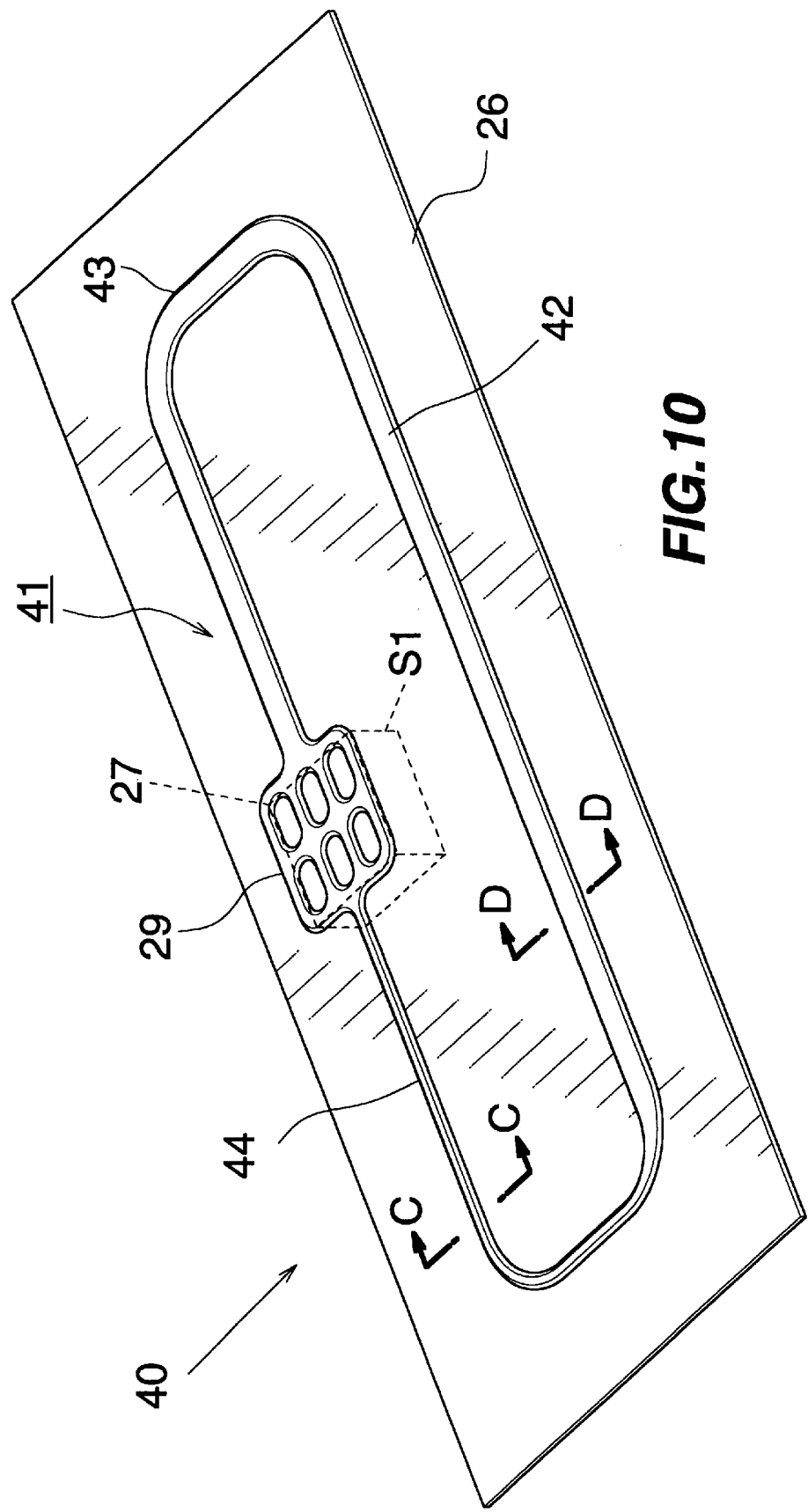
FIG. 10 is a perspective view showing another heat sink of the invention as a fifth embodiment.

FIG. 1 shows a notebook personal computer 200 equipped with a heat sink 1 as the first embodiment. With reference to FIG. 10 the computer 200 comprises a thin housing 400 having a keyboard 300, and a display device 500 which is free to open and close relative to the housing 400. The heat sink 1 is disposed beneath the keyboard within the housing 400. An MPU S is attached to the underside of the heat sink 1, with a heat transfer sheet 14 of rubber, synthetic resin or the like interposed therebetween.

FIGS. 2 to 6 show the first embodiment, i.e. heat sink 1. With reference to these drawings, the heat sink 1 comprises in its entirety an aluminum clad plate 10 composed of upper and lower two aluminum sheets 2, 3 and having a nonbonded portion in a required pattern. The nonbonded portion provides a heat pipe portion 5 formed by outwardly inflating the upper aluminum sheet 2 of the nonbonded portion to make a hollow portion 4 and enclosing a working liquid (not shown) in the hollow portion 4. Useful as the working liquid is PFC, HFC134a, CFC113, HCFC123 or the like. The working liquid is enclosed in an amount of about 5 to 75%, preferably about 40 to about 50%, of the capacity of the hollow portion 4. The working liquid is enclosed by forming a channel in the aluminum clad plate 10 in communication with the hollow portion 4 and extending to an outer edge of the plate 10 to provide an opening at the edge, injecting the liquid through the opening, and thereafter collapsing the upper aluminum sheet 2 of the channel portion flat and bonding the sheet 2 to the lower aluminum shoot 3 under pressure.

The upper aluminum sheet 2 is made, for example, from JIB A1230, and the lower aluminum sheet 3 is prepared, for example, from a continuous cast sheet of JIS AS3003. The aluminum clad plate 10 is prepared, for example, by the so-called roll bonding process because this process has the advantage of giving complex circuits of hollow portions, producing plates free of leakage, being highly amenable to mass production and having greater freedom with respect to the size and configuration of the product. With this process, a parting agent is printed in a required pattern on at least one of the opposed surfaces of two aluminum sheets 2, 3 to be joined, the sheets 2, 3 are then bonded in this state under pressure to obtain a clad plate having a nonbonded portion, and a pressurized fluid is introduced into the nonbonded portion of the clad plate to form a hollow portion 4 at a time. The parting agent to be used is, for example, an ink consisting mainly of colloidal graphite up to 1 micrometer in particle size. However, the process for producing the aluminum clad plate 10 is not limited to roll bonding.

The aluminum clad plate 10 is in the form of a rectangle having a relatively large width. The approximate center portion of the underside of the plate 10 serves as a portion for mounting an MPU. The heat pips portion 5 has a heat receiving portion 6 present at the MPU mount portion 13 and comprising a plurality of annular parts 8 in a concentric arrangement, and a plurality of short straight parts 9 for holding the adjacent annular parts 8 in communication with one another. All the annular parts 8 are equal to one another in width and height. All the short straight parts 9 are also equal to one another in width and height. The width of the annular parts 8 is equal to the width of the short straight parts 9, and is within the range of 0.5 to 20 mm. The height of the annular parts 8 is equal to the height of the short straight parts 9, and is within the range of 0.1 to 10 mm.

The heat pipe portion 5 has a plurality of long straight parts 7 extending radially from the heat receiving portion 6. The long straight parts 7 are greater than the annular parts 8 and the short straight parts in width.

Figure 5:
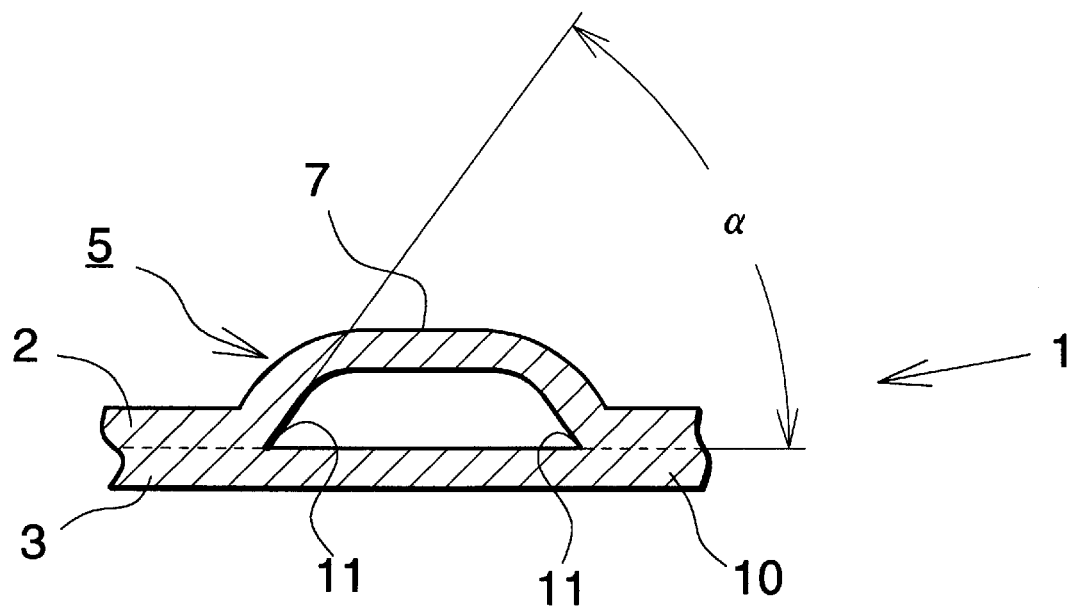
FIG. 5 is an enlarged view in section taken long the line A—A in FIG. 4.
Figure 6:
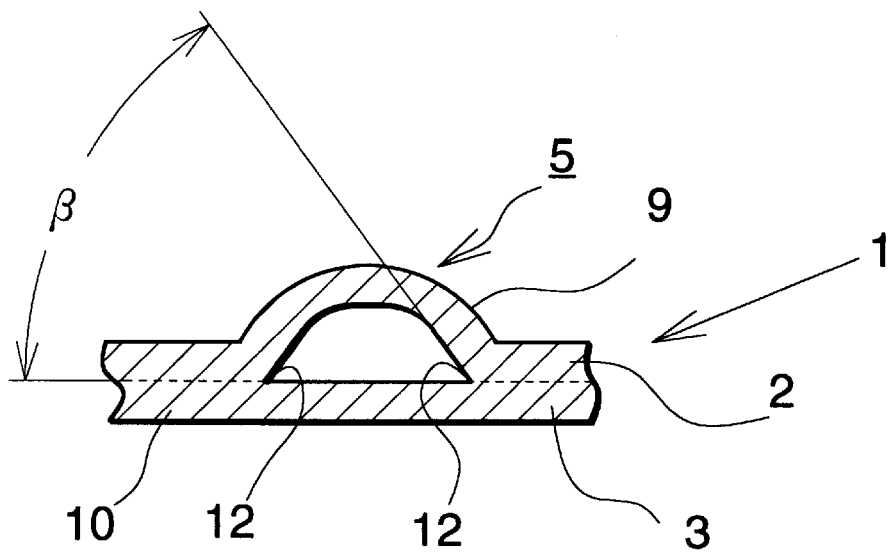
FIG. 6 is an enlarged view in section taken long the line B—B in FIG. 4.

An shown in FIG. 5, the long straight parts 7 arranged radially have joints 11 between the inner surface of the upper aluminum sheet 2 and the inner surface of the lower aluminum sheet 3, and the joints 11 are edgelike. It is desired that the joint 11 have an angle α of up to 60 deg between the inner surface of the upper aluminum sheet 2 and the inner surface of the lower aluminum sheet 3. In this case, the working liquid as liquefied again readily returns to the heat receiving portion 6 of the heat pipe portion 5 owing to a capillary effect of the joints 11.

With reference to FIG, 6, the short straight parts 9 have joints 12 between the inner surface of the upper aluminum sheet 2 and the inner surface of the lower aluminum sheet 3, and the joints 12 are edgelike. It is desired that the joint 12 have an angle β of up to 60 deg between the inner surface of the upper aluminum sheet 2 and the inner surface of the lower aluminum sheet 3. In this case, the working liquid becomes readily retainable by the heat receiving portion 6 owing to an increased capacity to retain the liquid due to a capillary effect of the joints 12. Although not shown, the annular part 8 has exactly the same cross sectional shape as the short straight part 9.

The joints 11 of the long straight part 7, and the joints 12 of the short straight part 9 and the annular part 8 may be rounded instead of being edgelike. In this case, it is desired that the joints 11, 12 have a radius of curvature of up to 1 mm.

Figure 2:
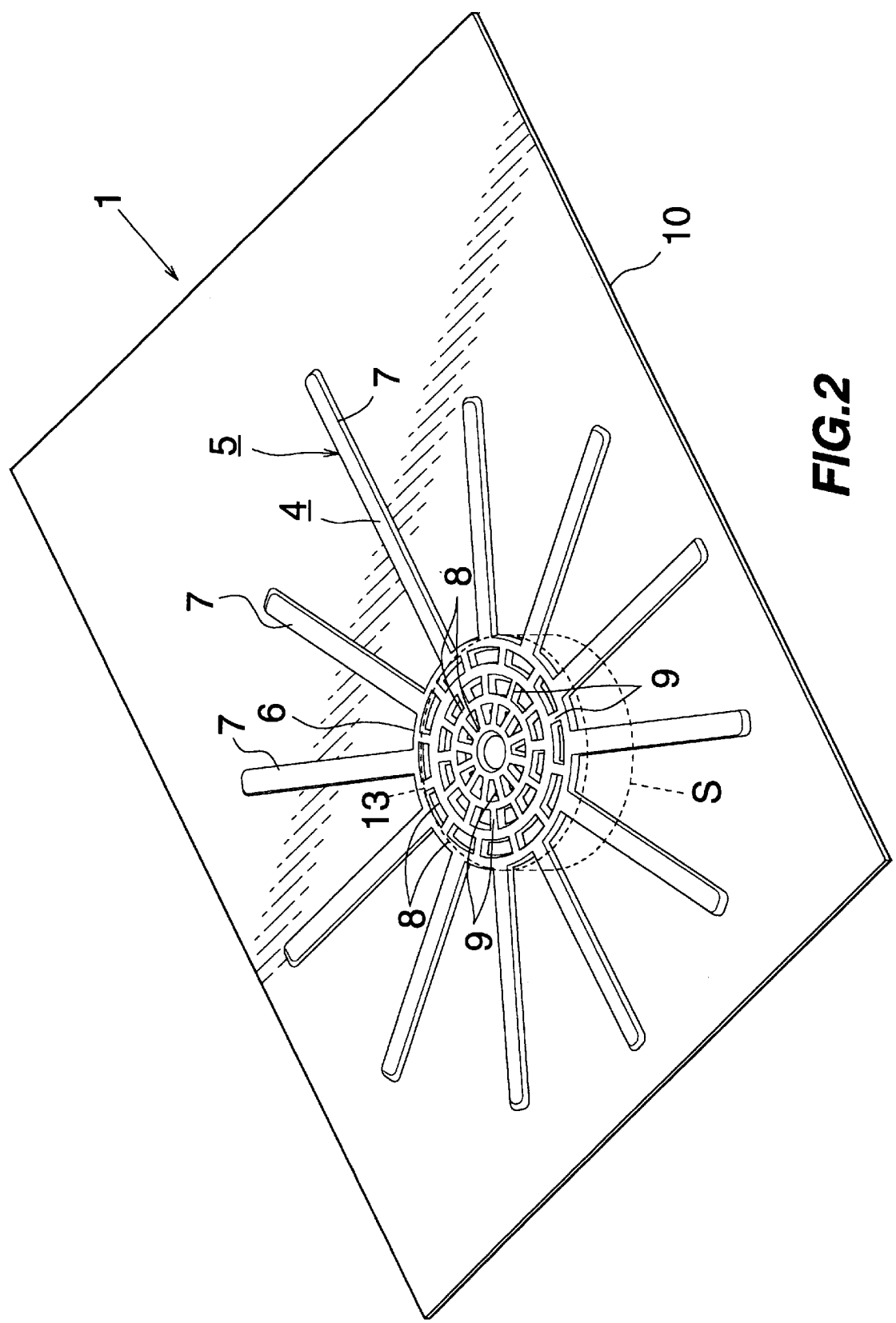
FIG. 2 is a perspective view showing the heat sink.
Figure 3:
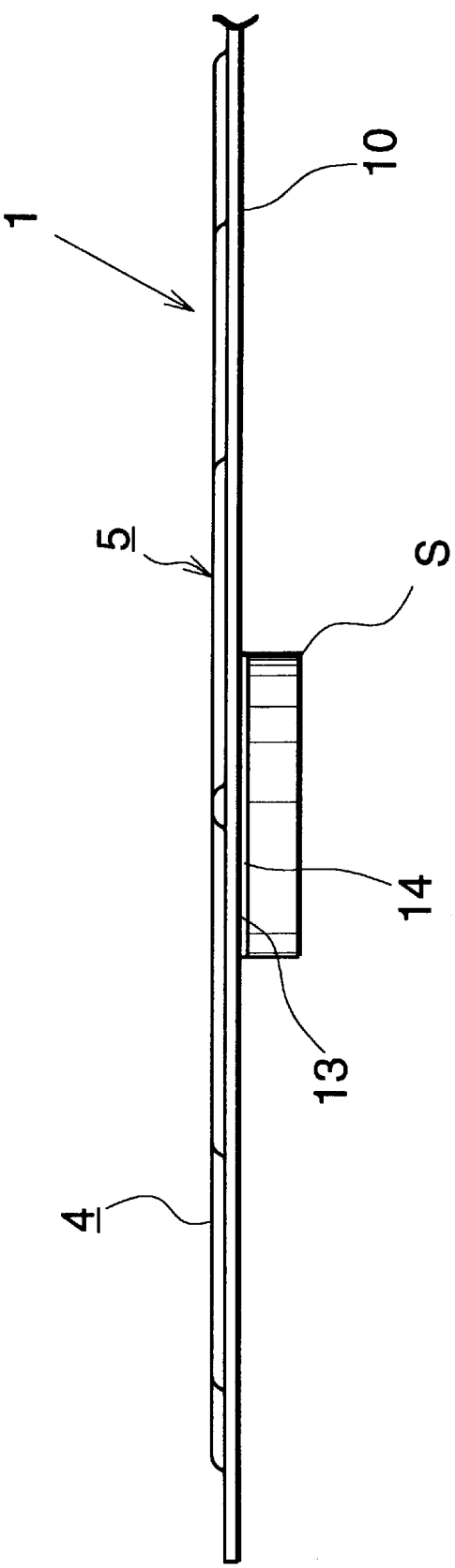
FIG. 3 is a side elevation of the heat sink.
Figure 4:
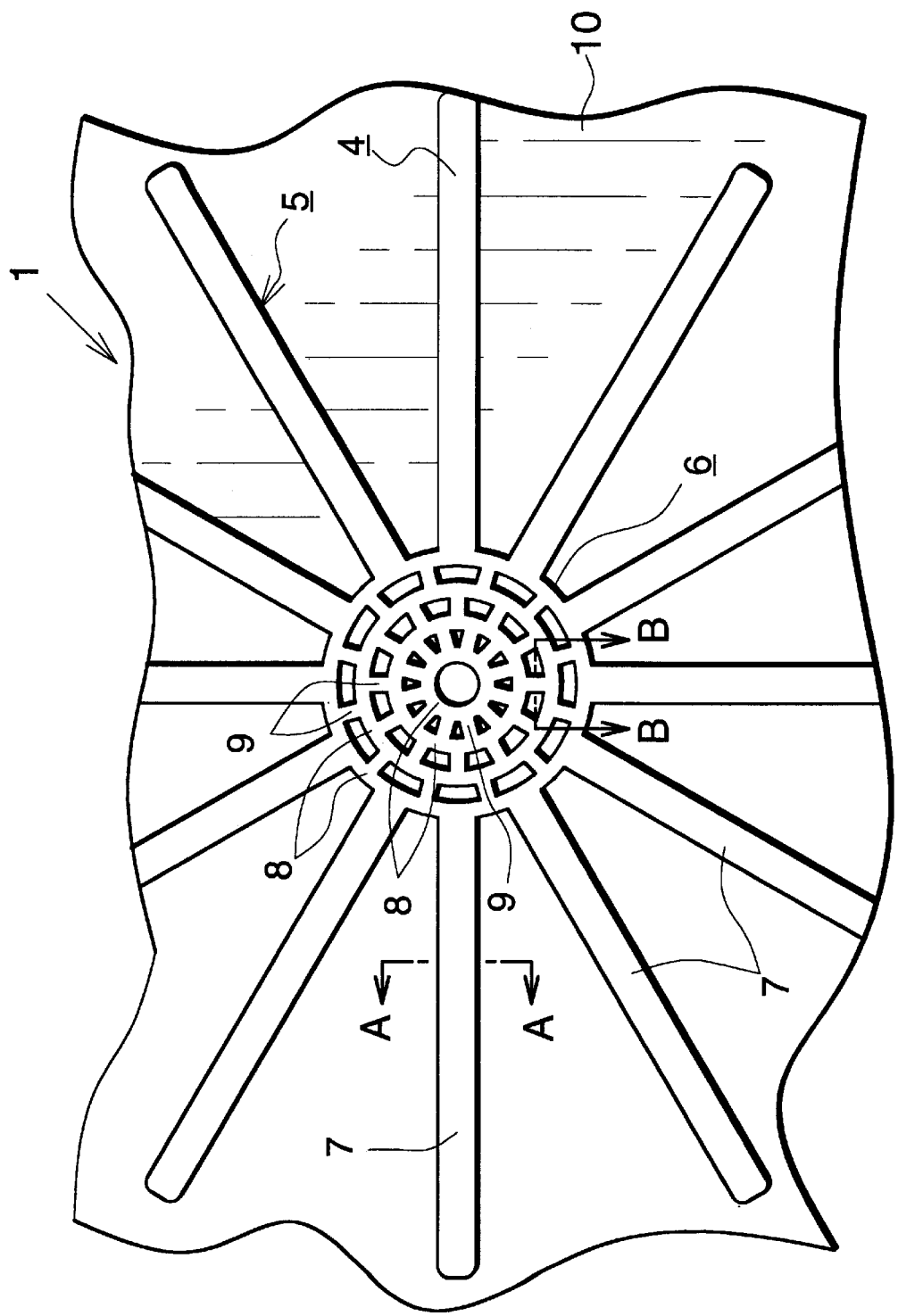
FIG. 4 is a fragmentary plan view of the heat sink.

With reference to FIGS. 1 to 3, the MPU S, which is in the form of a short solid cylinder, is attached to the MPU mount portion 13 on the underside of the aluminum clad plate 10 having the foregoing construction for use as the heat sink 1, with a heat transfer sheet 14 of rubber, synthetic resin or the like interposed between the MPU S and the mount portion 13. The MPU S is nearly as large as the mount portion 13. The heat generated by the MPU S is transmitted to the working liquid within the heat receiving portion 6 of the heat pipe portion 5 through the upper and lower aluminum sheets 2, 3. The working liquid heated with the heat evaporates in the portion 6 into a gas, which flows through all the long straight parts 7 toward their outer ends. The gas releases heat at these parts through the aluminum clad plate 10 and liquefies. The working liquid thus liquefied again returns to the heat receiving portion 6 by virtue of the capillary effect of the joints 11 in the cross section of the long straight parts 7. The portion of working liquid originally remaining in the long straight parts 7 also flows toward the heat receiving portion 6 owing to the capillary effect of the joints 11 in the cross section of the long straight parts 7. The phenomena and movement described are repeated to dispose of the heat generated by the MPU S.

The heat produced by the MPU S is transferred to the working liquid retained in the heat receiving portion 6 solely through the aluminum sheets 2,3 providing the portion 6, so that the heat can be transferred to the working liquid with an improved efficiency. Furthermore, the gas converted from the liquid in the heat receiving portion 6 flows through the long straight parts 7 toward their outer ends and liquefies again at a location sufficiently away from the MPU mount portion 13, consequently releasing the heat at a portion sufficiently away from the MPU S and having a relatively low temperature. This achieves an improved heat disposal efficiency.

The annular parts 8 and the short straight parts 9 have a smaller width than the radially arranged long straight parts 7. The heat receiving portion 6 is therefore given increased ability to retain the working liquid by this feature and also by the capillary effect of the joints 12 of the annular parts 8 and the short straight parts 9. As a result, the heat receiving portion 6 of the heat pipe portion 5 has retained therein the working liquid at all times and in less susceptible to a drying-out phenomenon.

Figure 7:
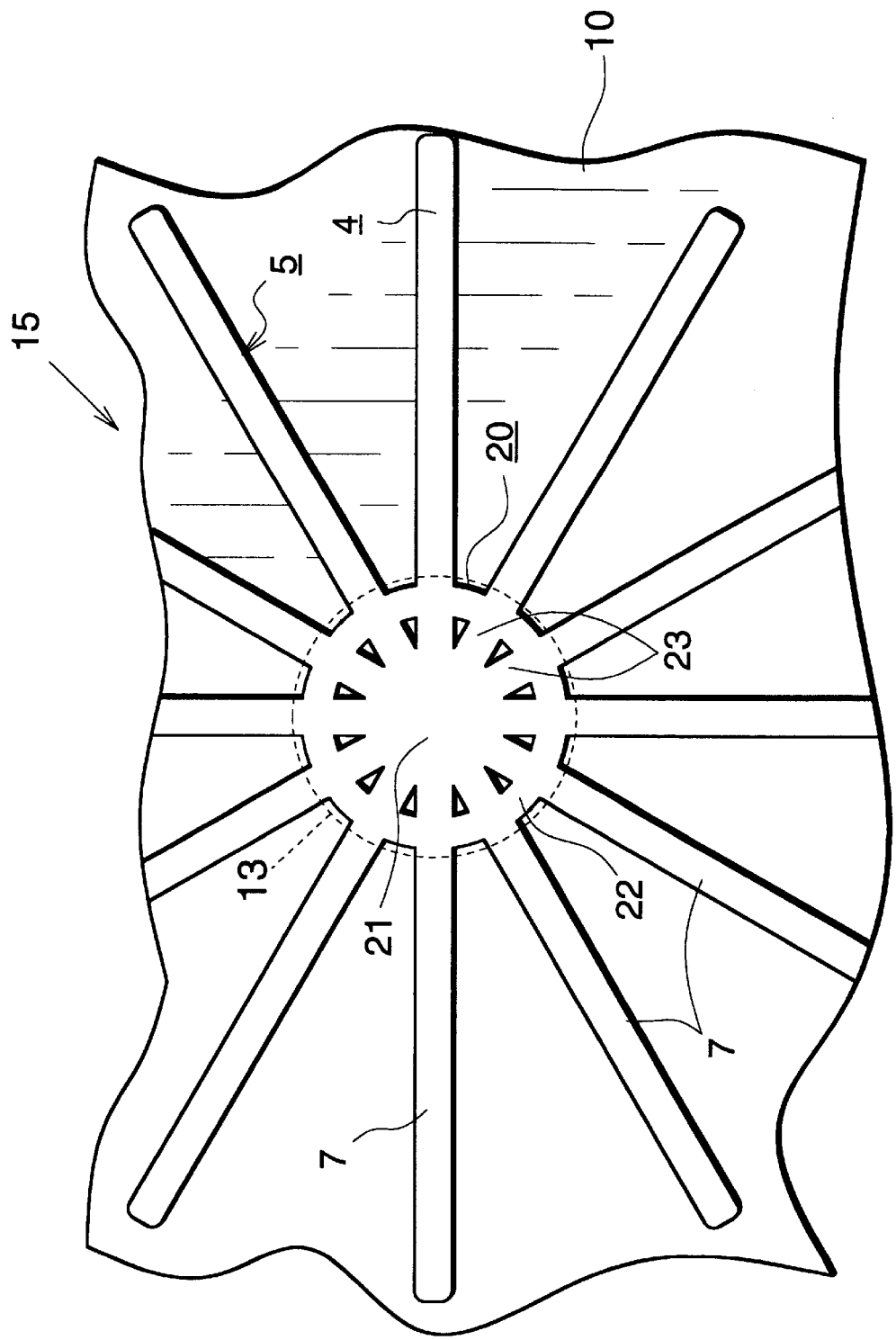
FIG. 7 is a fragmentary plan view showing another heat sink of the invention as a second embodiment.

FIG. 7 shows another heat sink 15 as a second embodiment of the invention. With reference to FIG. 7, the heat sink 15 of the second embodiment differs from the heat sink 1 of the first embodiment in that the heat pipe portion 5 has a heat receiving portion 20 which comprises a circular part 21, an annular part 22 spaced apart from the circular part 21 radially outward and concentric therewith, and a plurality of short straight parts 23 for causing the circular part 21 to communicate with the annular part 22. The width of the annular part 22 and all the short straight parts 23 is equal to the width of long straight parts 7 radially extending from the annular part 23.

Although not shown, the joints between the inner surface of the upper aluminum sheet 2 and the inner surface of the lower aluminum sheet 3 for providing the annular part 22 and the short straight parts 23 may be edgelike or rounded. In the former case, it is desired that the edgelike joint have an angle of up to 60 deg between the inner surface of the upper aluminum sheet 2 and the inner surface of the lower aluminum sheet 3. In the latter case, the rounded joints preferably have a radium of curvature of up to I mm.

Like the heat sink 1 of the first embodiment, the heat sink 15 is incorporated into a notebook personal computer 200. An MPU S is attached to the mount portion 13 on the underside of the sink with a heat transfer sheet (not shown) interposed therebetween. The heat produced by the MPU S is disposed of in the same manner as in the case of the heat sink of the first embodiment.

Figure 8:
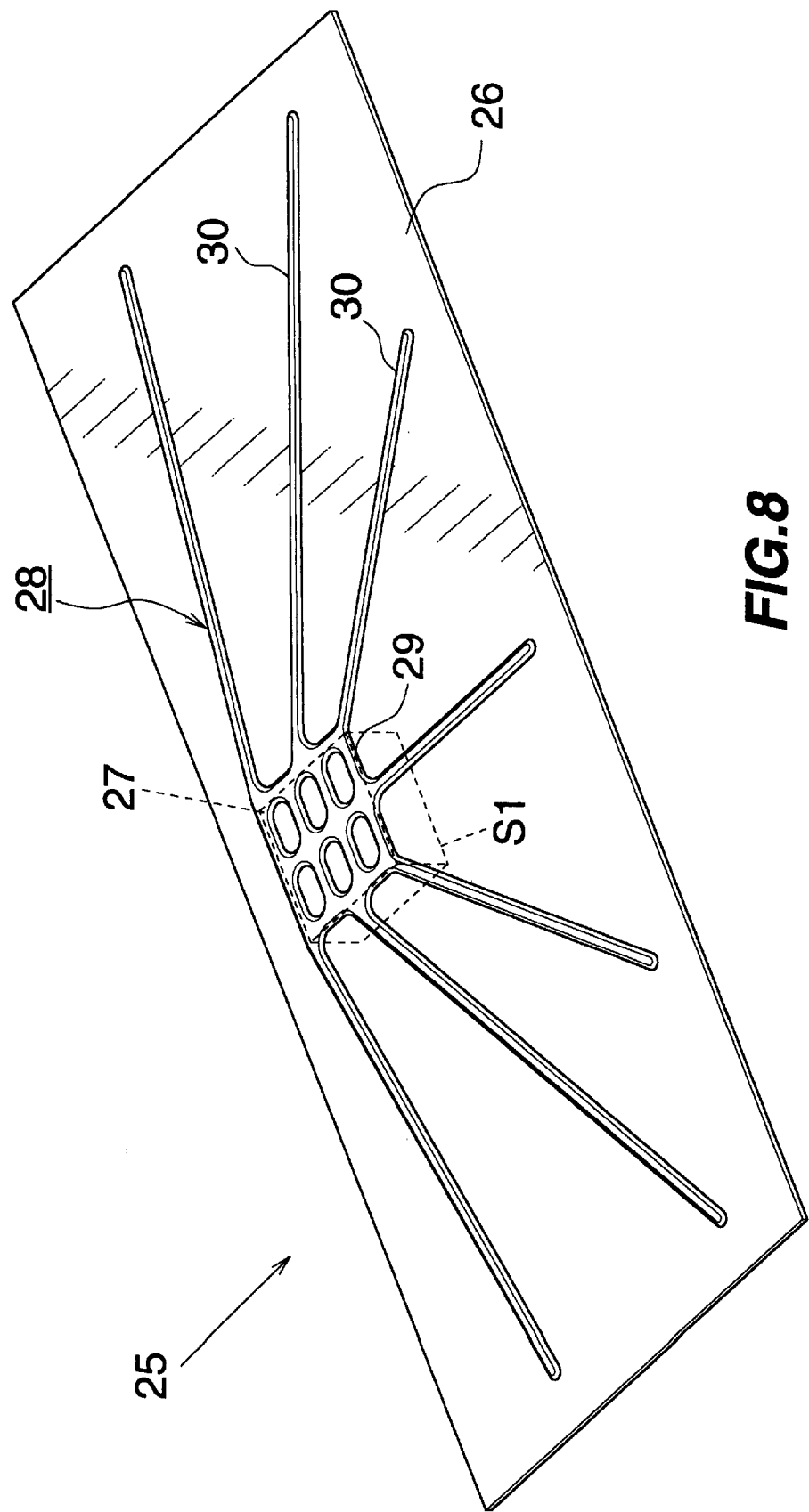
FIG. 8 is a perspective view showing another heat sink of the invention as a third embodiment.

FIG. 8 shows another heat sink 25 as a third embodiment of the invention. With reference to FIG. 8, the heat sink 25, which is fabricated in the same manner as the heat sink 1 of the first embodiment, comprises an aluminum clad plate 26 which is in the form of a rectangle having a relatively small width. The underside of the plate 26 provides an MPU mount portion 29 at the midportion of its length closer to one long side of the plate. The heat pipe portion 28 of the sink has at the region providing the mount portion 27 a heat receiving portion 29 which is latticelike. The heat pipe portion 28 has a plurality of straight parts 30 extending radially from the heat receiving portion 29 and varying in length.

Like the heat sink 1 of the first embodiment, the heat sink 25 is incorporated into a notebook personal computer 200. An MPU S1 in the form of a short quadrangular prism is attached to the mount portion 27 on the underside of the sink with a heat transfer sheet (not shown) interposed therebetween. The MPU S1 has approximately the same size as the heat receiving portion 29, The heat produced by the MPU S1 in disposed of in the same manner as in the case of the heat sink 1 of the first embodiment.

Figure 9:
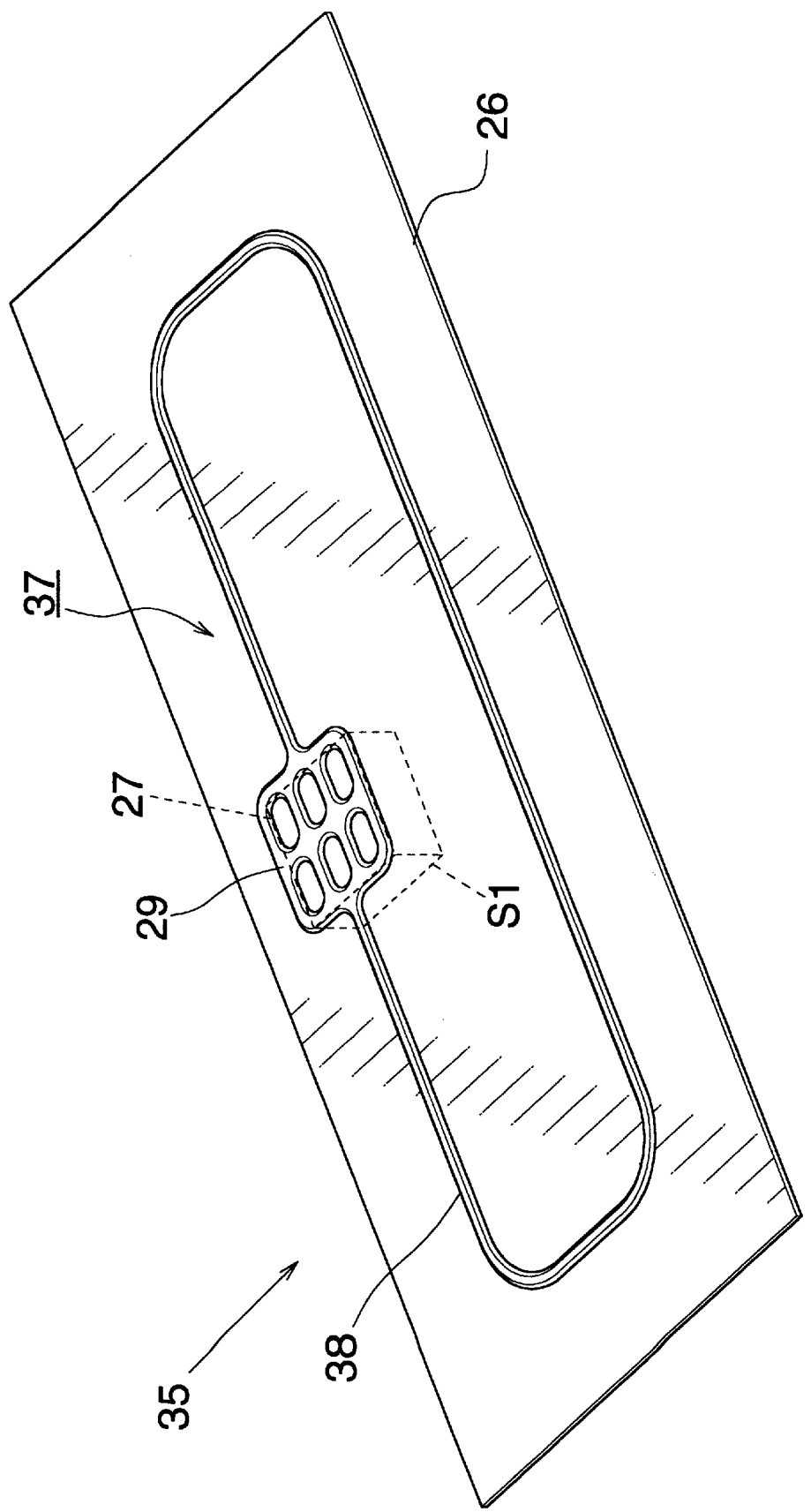
FIG. 9 is a perspective view showing another heat sink of the invention as a fourth embodiment.

FIG. 9 shows another heat sink 35 as a fourth embodiment of the invention. With reference to FIG. 9, the heat sink 35 of the fourth embodiment differs from the heat sink 25 of the third embodiment mainly in that the heat pipe portion 37 of the sink 35 comprises a looplike part 38 communicating at opposite ends thereof with the heat receiving portion 29 in place of the straight parts extending radially from the portion 29. The looplike part 38 is elongated longitudinally of the aluminum clad plate 26 and is generally rectangular. The looplike part has a uniform channel cross sectional area in its entirety.

Like the beat sink 1 of the first embodiment, the heat sink 35 is incorporated into a notebook personal computer 200. An MPU S1 is attached to the mount portion 27 on the underside of the sink with a heat transfer sheet (not shown) interposed therebetween. The heat produced by the MPU S1 is transferred to the working liquid within the heat receiving portion 29 of the heat pipe portion 37 through the upper and lower aluminum sheets. The working liquid heated with the heat evaporates in the portion 29 into a gas, which flows into the looplike part 38 and further flows in a direction away from the heat receiving portion 29, releasing heat through the aluminum clad plate 26 to liquefy. The working liquid thus liquefied again circulates or flows reversely through the looplike part 38 and returns to the heat receiving portion 29. The portion of working liquid originally remaining in the looplike part 38 also flows toward the heat receiving portion 29. The phenomena and movement described are repeated to dispose of the heat generated by the MPU S1.

Figure 11:
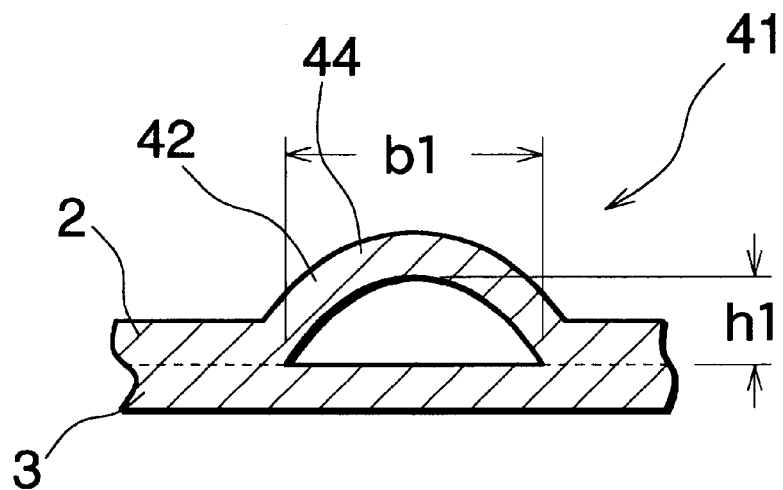
FIG. 11 is an enlarged view in section taken along the line C—C in FIG. 10.
Figure 12:
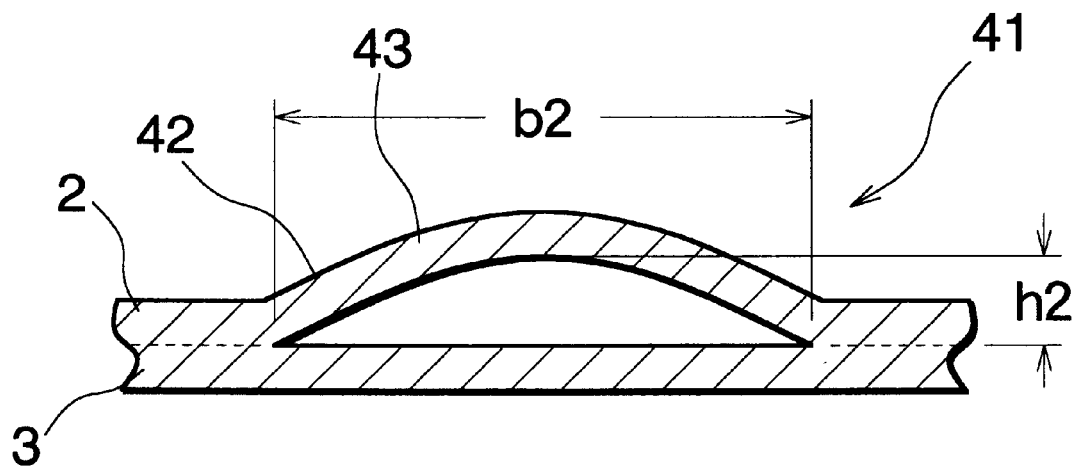
FIG. 12 is an enlarged view in auction taken along the line D—D in FIG. 10.

FIGS. 10 to 12 show another heat sink 40 as a fifth embodiment of the invention. With reference to FIG. 10, the heat sink 40 of the fifth embodiment differs from the heat sink 35 of the fourth embodiment mainly in that the heat pipe portion 41 of the sink 40 has a looplike part 42 which comprises a part 43 of great channel cross sectional area and a part 44 of small channel cross sectional area. Thus, the looplike part 42 at opposite sides of the heat receiving portion 29 is greater at one side than at the other side in channel cross sectional area. The part 43 of great channel cross sectional area is larger than the part 44 of small channel cross sectional area in length.

With reference to FIG. 11, the part 44 of small cross sectional area preferably has a width b1, for example, of up to 3.5 mm and a height h1, for example, of up to 3.5 mm. As shown in FIG. 12, the part 43 of great cross sectional area preferably has a width b2, for example, of up to 20 mm and a height h2, for example, of up to 10 mm.

Like the heat sink 1 of the first embodiment, the heat sink 40 is incorporated into a notebook personal computer 200. An MPU S1 is attached to the mount portion 27 on the underside of the sink with a heat transfer sheet (not shown) interposed therebetween. The heat produced by the MPU S1 is transferred to the working liquid within the heat receiving portion 29 of the heat pipe portion 41 through the upper and lower aluminum sheets 2, 3. The working liquid heated with the heat evaporates in the portion 29 into a gas, which flows into the looplike part 42. Since the part 43 of great channel cross sectional area is lower than the part 44 of small channel cross sectional area in pressure loss, the gas flows into the part 43 of great cross section in a larger amount, The gas of working liquid flowing into the looplike part 42 further flows in a direction away from the heat receiving portion 29, releasing heat through the aluminum clad plate 26 to liquefy, The working liquid thus liquefied again circulates or flows reversely through the looplike part 42 and returns to the heat receiving portion 29. The portion of working liquid originally remaining in the looplike part 42 also flows toward the heat receiving portion 29. The phenomena and movement described ore repeated to dispose of the heat generated by the MPU S1.

Figure 13:
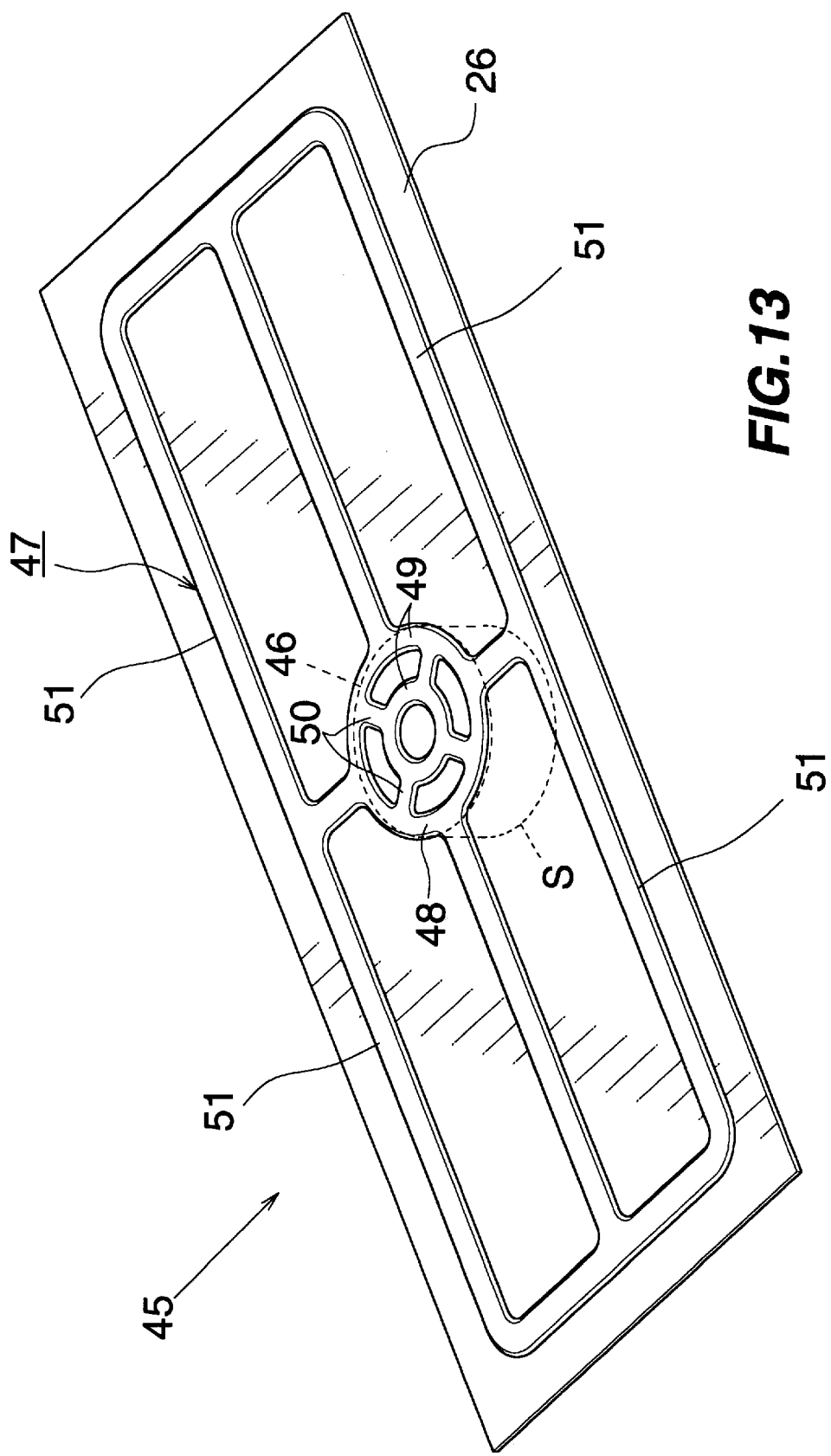
FIG. 13 is a perspective view showing another heat sink of the invention as a sixth embodiment.

FIG. 13 shows another heat sink 45 as a sixth embodiment of the invention. With reference to FIG. 13, the hoot sink 45 of the sixth embodiment differs from the heat sink 35 of the fourth embodiment mainly in the following construction. The canter portion of the underside of the aluminum clad plate 26 serves as an MPU mount portion 46. The sink has a heat pipe portion 47 including a heat receiving portion 48 which comprises a plurality of, e.g., two, annular parts 49 formed concentrically, and a plurality of short straight parts 50 for holding the adjacent annular parts 49 in communication with each other. The heat pipe portion 47 has two looplike parts 51 at each of opposite sides of the heat receiving portion 48, the looplike parts 51 each communicating at its opposite ends with the portion 48. The looplike parts 51 provided are four in total number.

All the annular parts 49 of the heat receiving portion 48 are each in width, as well as in height. All the short straight parts 50 are also equal in width, an well as in height. The width of the annular parts 49 is equal to the width of the short straight parts 50. The height of the annular parts 49 are equal to the height of the short straight parts 50.

Each looplike part 51 of the heat pipe portion 47 is elongated longitudinally of the aluminum clad plate 26, rectangular and uniform in channel cross sectional area in its entirety. Furthermore, all the looplike parts 51 are equal in channel cross sectional area. The adjacent looplike parts 51 share a portion. The combination of all looplike parts 51 has a rectangular contour.

Like the heat sink 1 of the first embodiment, the heat sink 45 is incorporated into a notebook personal computer 200. An MPU S is attached to the mount portion 46 on the underside of the sink with a heat transfer sheet (not shown) interposed therebetween. The heat produced by the MPU S is transferred to the working liquid within the heat receiving portion 48 of the heat pipe portion 47 through the upper and lower aluminum sheets. The working liquid heated with the heat evaporates in the portion 48 into a gas, which flows into the looplike parts 51 of the heat pipe portion 47 and further flows in a direction away from the heat receiving portion 48, releasing heat through the aluminum clad plate 26 to liquefy. The working liquid thus liquefied again circulates or flows reversely through the looplike parts 51 and returns to the heat receiving portion 48. The portion of working liquid originally remaining in the looplike parts 51 also flows toward the heat receiving portion 48. The phenomena and movement described are repeated to dispose of the heat generated by the MPU S.

Figure 14:
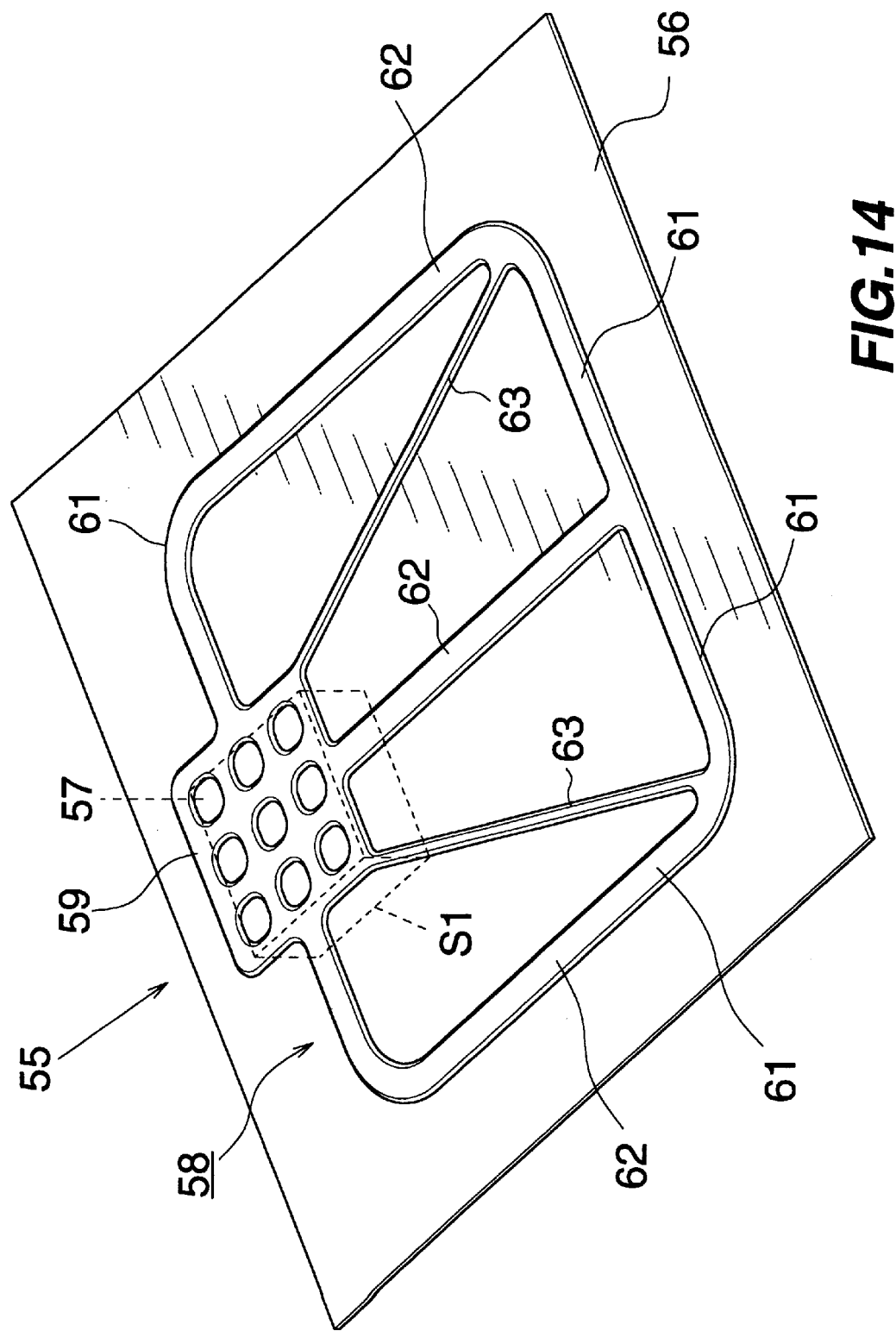
FIG. 14 is a perspective view showing another heat sink of the invention as a seventh embodiment.

FIG. 14 show another heat sink 55 as a seventh embodiment of the invention. With reference to FIG. 14, the heat sink 55 is fabricated in the same manner an the heat sink 1 of the first embodiment. The aluminum clad plate 56 of this sink has a rectangular shape approximate to a square. The center portion of the underside of the plate provides an MPU mount portion 57 at a location close to one long side of the plate. The heat pipe portion 58 has a latticelike heat receiving portion 59 at the region providing the MPU mount portion 57.

The heat pipe portion 58 has a plurality of, e.g., four, generally trapezoidal looplike parts 61 each communicating at opposite ends thereof with the heat receiving portion 59. The adjacent looplike parts 61 share a part. The combination of all the looplike parts 61 has a rectangular contour. Each looplike part 61 comprises a part 62 of great channel cross sectional area and a part 63 of small channel cross sectional area. At opposite sides of the heat receiving portion 59, the looplike part 61 is greater at one side than at the other side in channel cross sectional area. The part 62 of great channel cross sectional area is larger than the part 63 of small channel cross sectional area in length.

Like the heat sink 1 of the first embodiment, the heat sink 55 is incorporated into a notebook personal computer 200, An MPU S1 is attached to the mount portion 57 on the underside of the sink with a heat transfer sheet (not shown) interposed therebetween. The heat produced by the MPU S1 is transferred to the working liquid within the heat receiving portion 59 of the heat pipe portion 58 through the upper and lower aluminum sheets. The working liquid heated with the heat evaporates in the portion 59 into a gas, which flows into the looplike parts 61. Since the parts 62 of great channel cross sectional area is lower than the parts 63 of small channel cross sectional area in pressure loss, the gas flows into the parts 62 of great cross section in a larger amount. The gas of working liquid flowing into the looplike parts 61 further flows in a direction away from the heat receiving portion 59, releasing heat through the aluminum clad plate 56 to liquefy. The working liquid thus liquefied again circulates or flows reversely through the looplike parts 61 and returns to the heat receiving portion 59. The portion of working liquid originally remaining in the looplike parts 61 also flows toward the heat receiving portion 59. The phenomena and movement described are repeated to dispose of the heat generated by the MPU S1.

Figure 15:
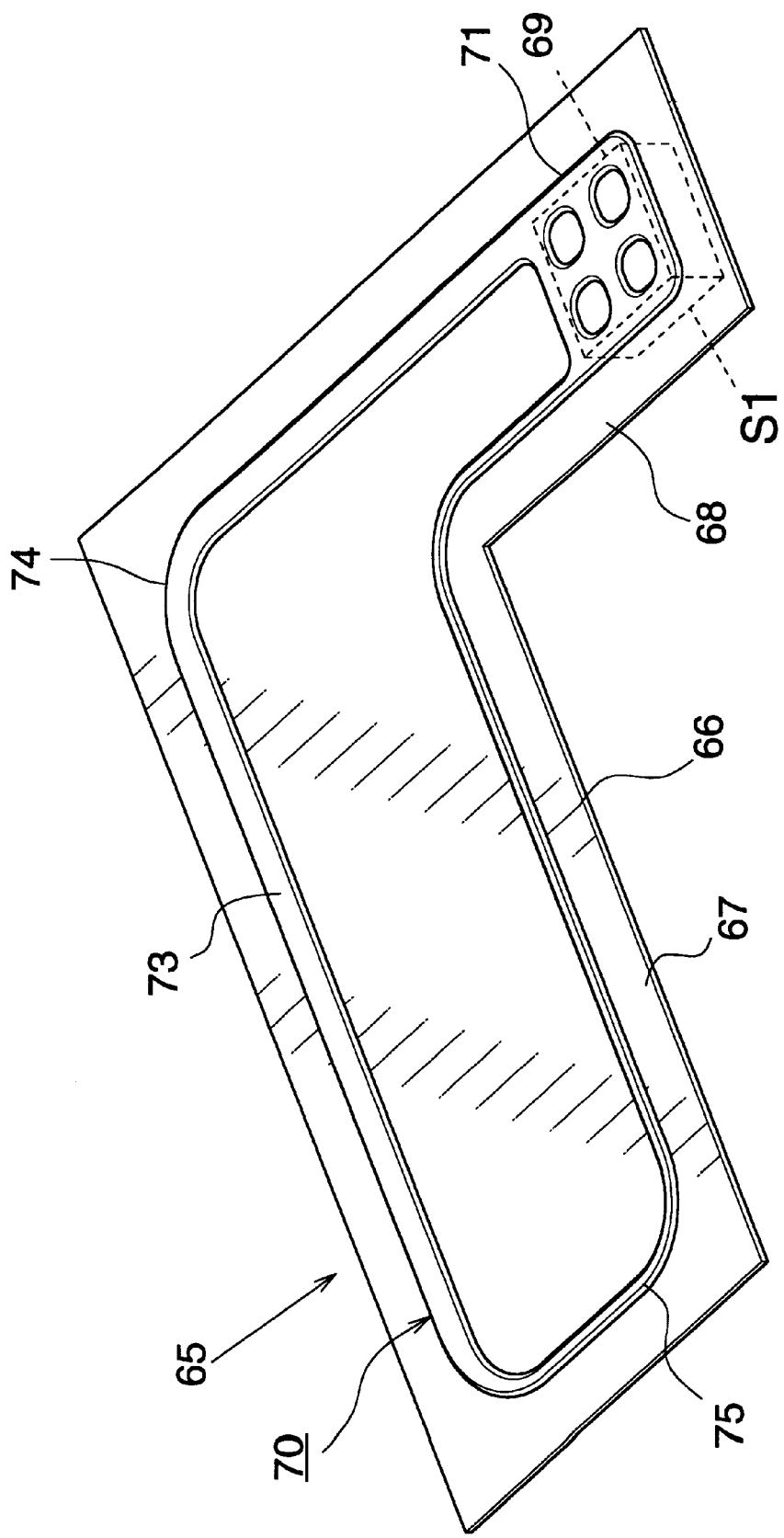
FIG. 15 is a perspective view showing another heat sink of the invention as a eighth embodiment.

FIG. 15 shows another heat sink 65 of the invention as an eighth embodiment. With reference to FIG. 15, the heat sink 65 is fabricated in the same manner as the heat sink 1 of the first embodiment. However, the sink comprises an aluminum clad plate 66 which is L-shaped and comprises a long rectangular portion 67, and a short rectangular portion 68 integral with the portion 67 at one and of its one long side. The underside of the outer end of the short rectangular portion 68 provides an MPU mount portion 69.

A heat pipe portion 70 has a latticelike heat receiving portion 71 at the region providing the MPU mount portion 69.

The heat pipe portion 70 has an L-shaped looplike part 73 communicating at opposite ends thereof with the heat receiving portion 71. The looplike part 73 comprises a part 74 of great channel cross sectional area and a part 75 of small channel cross sectional area. At opposite sides of the heat receiving portion 71, the looplike part 73 is greater at one side than at the other side in channel cross sectional area. The part 74 of great channel cross sectional area is nearly equal to the part 75 of small channel cross sectional area in length.

Like the host sink 1 of the first embodiment, the heat sink 65 is incorporated into a notebook personal computer 200. An MPU S1 is attached to the mount portion 69 on the underside of the sink with a heat transfer sheet (not shown) interposed therebetween. The heat produced by the MPU S1 is disposed of in the some manner as is the case with the heat sink 40 of the fifth embodiment described.

Figure 16:
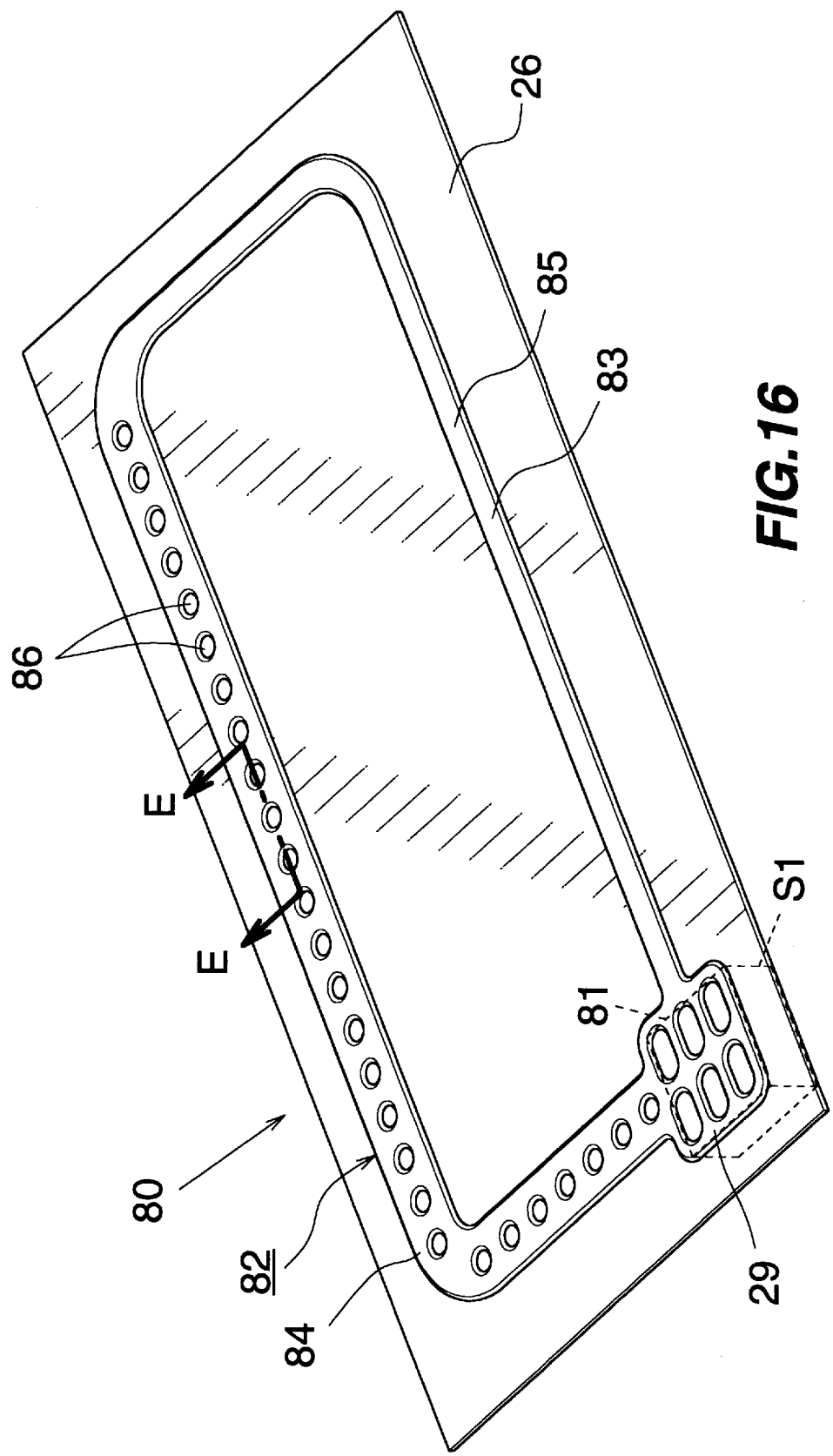
FIG. 16 is a perspective view showing another heat sink of the invention an a ninth embodiment.
Figure 17:
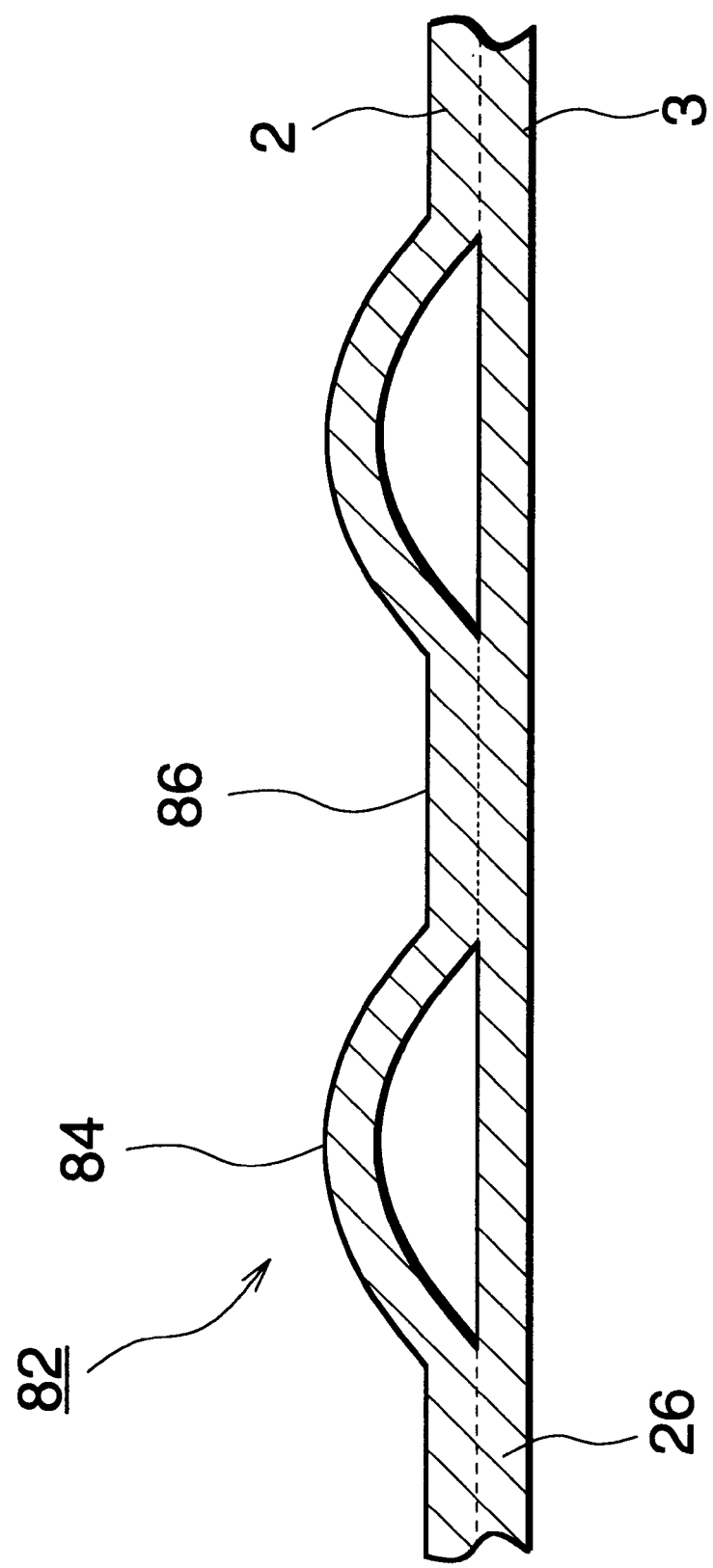
FIG. 17 is an enlarged view in section taken along the line E—E in FIG. 16.

FIGS. 16 and 17 show another heat sink 80 as a ninth embodiment of the invention. With reference to FIG. 16, the heat sink 80 of the ninth embodiment differs from the heat sink 40 of the fifth embodiment mainly in that the aluminum clad plate 26 has one corner which provides an MPU mount portion 81 on the underside thereof. Another main difference is that a heat pipe portion 82 has a looplike part 83 communicating at opposite ends thereof with the heat receiving portion 29 and comprising a part 84 of great channel cross sectional area and a part 85 which is small in this area. At opposite sides of the heat receiving portion 29, the looplike part 83 is greater at one side than at the other side in channel cross sectional area. For example, as seen in FIG. 16, the part 84 of great area has a plurality of bonded spots 86 recessed like dimples as shown in FIG. 17, arranged at an interval longitudinally thereof and formed by bonding the upper aluminum sheet 2 to the lower aluminum sheet 3 under pressure. The presence of the bonded spots 86 gives improved pressure resistance to the part 84 of great channel cross sectional area.

The length of the part 84 of great area is approximately equal to the length of the part 85 of small area.

Like the heat sink 1 of the first embodiment, the heat sink 80 is incorporated into a notebook personal computer 200. An MPU S1 is attached to the mount portion 81 on the underside of the sink with a heat transfer sheet (not shown) interposed therebetween. The heat produced by the MPU S1 is disposed of in the same manner as is the case with the heat sink 40 of the fifth embodiment described. At this time, the presence of the bonded spots 86 stirs the gas of working liquid and also increases the area of contact between the gas and the aluminum hosts 2, 3, consequently effecting efficient re-liquefaction of the gas.

Figure 18:
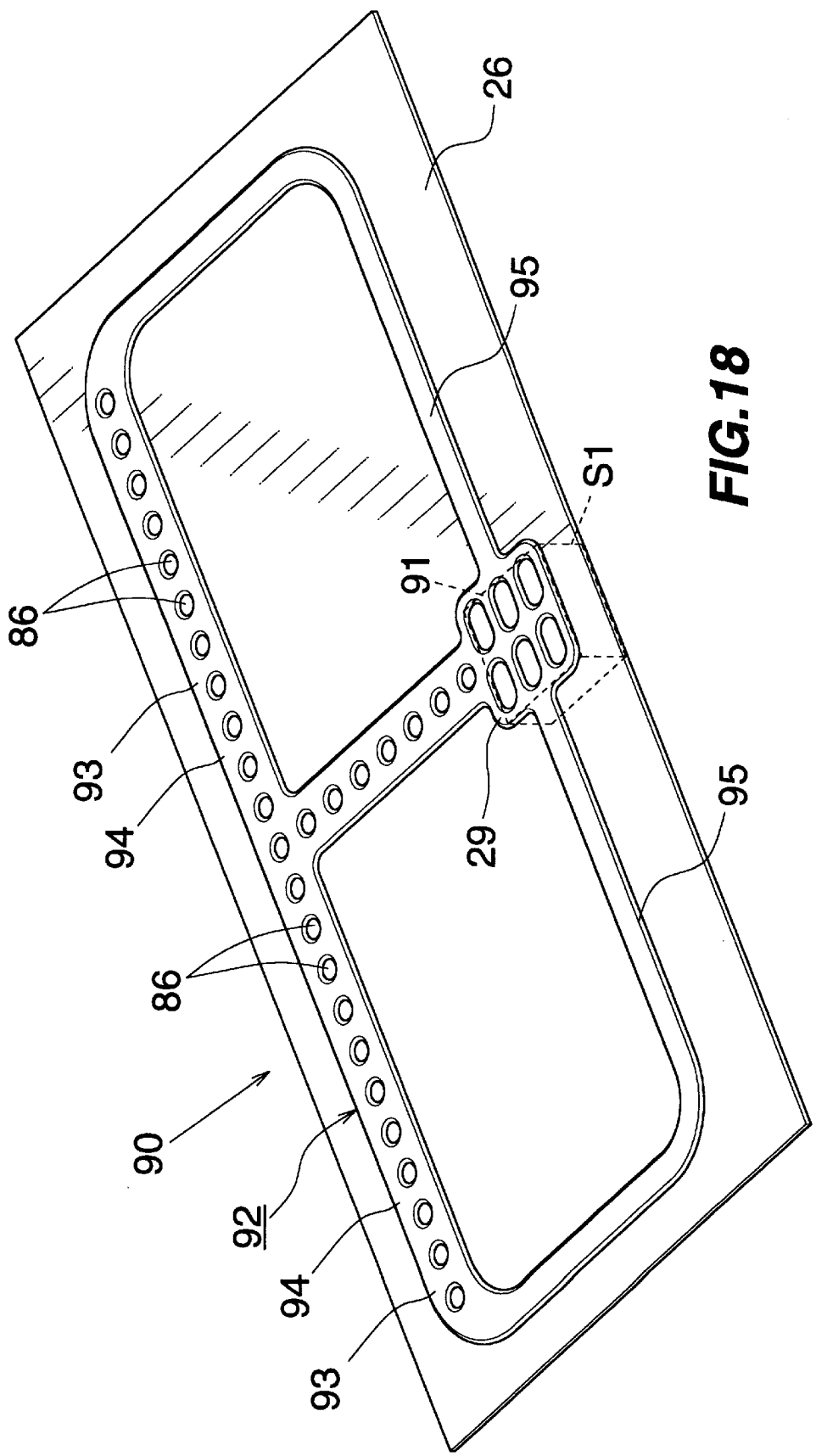
FIG. 18 is a perspective view showing another heat sink of the invention as a tenth embodiment.

FIG. 18 shows another heat sink 90 as a tenth embodiment of the invention. With reference to FIG. 18, the heat sink 90 of the tenth embodiment differs from the heat sink 80 of the ninth embodiment mainly in that an MPU mount portion 91 is provided at the lengthwise midportion of the aluminum clad plate 26 closer to one long side thereof, and that the sink comprises a heat pipe portion 92 which has two opposite looplike parts 93 each communicating at opposite ends thereof with the heat receiving portion 29. The looplike parts 93 are each in the form of a rectangle which is elongated longitudinally of the clad plate 26. The two looplike parts 93 share a portion. The combination of the two looplike parts 93 has a rectangular contour. Each looplike part 93 comprises a part 94 of great channel cross sectional area, and a part 95 which is small in this area. At opposite sides of the heat receiving portion 29, the looplike part 93 is greater at one side than at the other side in channel cross sectional area. In each part 93, the length of the part 94 of great area is approximately equal to that of the part 95 of small area. The part 94 of great area is formed with bonded spots 86 similar to those of the ninth embodiment and arranged at an interval longitudinally thereof. The presence of the bonded sports 86 also gives improved pressure resistance to the part 94 of great area also in this case.

Like the heat sink 1 of the first embodiment, the heat sink 90 is incorporated into a notebook personal computer 200. An MPU S1 is attached to the mount portion 91 on the underside of the sink with a heat transfer sheet (not shown) interposed therebetween. The heat produced by the MPU S1 is disposed of in the same manner as is the case with the heat sink 55 of the seventh embodiment described. At this time, the presence of the bonded spots 86 stirs the gas of working liquid and also increases the area of contact between the gas and the aluminum sheets, consequently effecting efficient re-liquefaction of the gas.

Figure 19:
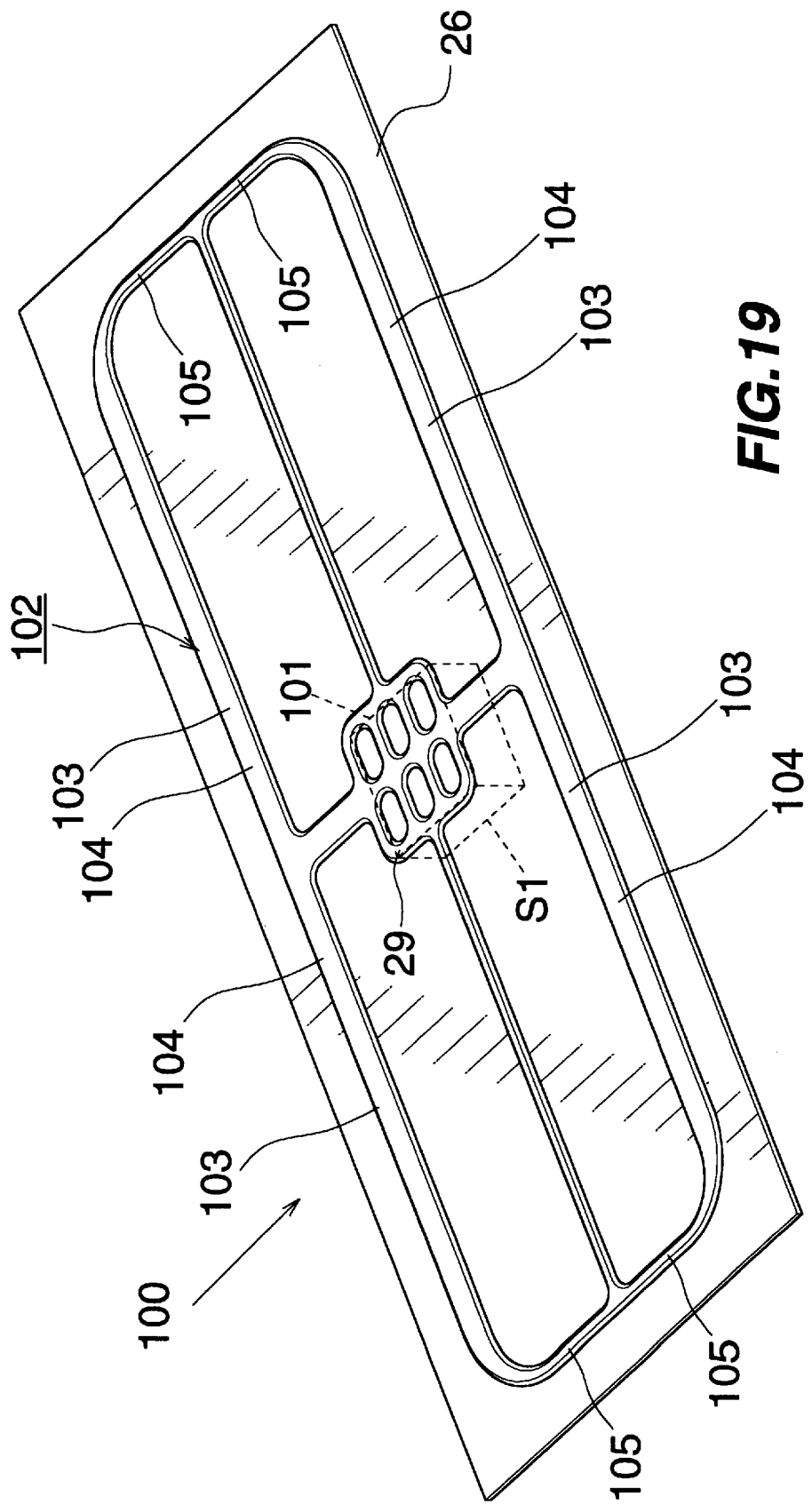
FIG. 19 is a perspective view showing another heat sink of the invention as a eleventh embodiment.

FIG. 19 shows another heat sink 100 as an eleventh embodiment of the invention. With reference to FIG. 19, the heat sink 100 of the eleventh embodiment differs from the heat sink 90 of the tenth embodiment mainly in that an MPU mount portion 101 is provided at the center of underside of the aluminum clad plate 26, and that the sink comprises a heat pipe portion 102 which has two rectangular looplike parts 103 at each of right and left sides of the heat receiving portion 26, i.e., four looplike parts 103 in total, each of the parts 103 communicating at opposite ends thereof with the heat receiving portion 29. The adjacent looplike parts 103 share a portion. The combination of all the looplike parts 103 has a rectangular contour. Each looplike part 103 comprises a part 104 of great channel cross sectional area, and a part 105 which is small in this area, At opposite sides of the heat receiving portion 29, the looplike part 103 is greater at one side than at the other side in channel cross sectional area. Another main difference in that the part 104 of great channel cross sectional area of each looplike part 103 has no bonded spots described.

Like the heat sink 1 of the first embodiment, the heat sink is incorporated into a notebook personal computer 200. An MPU S1 is attached to the mount portion 101 on the underside of the sink with a heat transfer sheet (not shown) interposed therebetween. The heat produced by the MPU S1 is disposed of in the same manner as is the case with the heat sink 55 of the seventh embodiment described.

Figure 20:
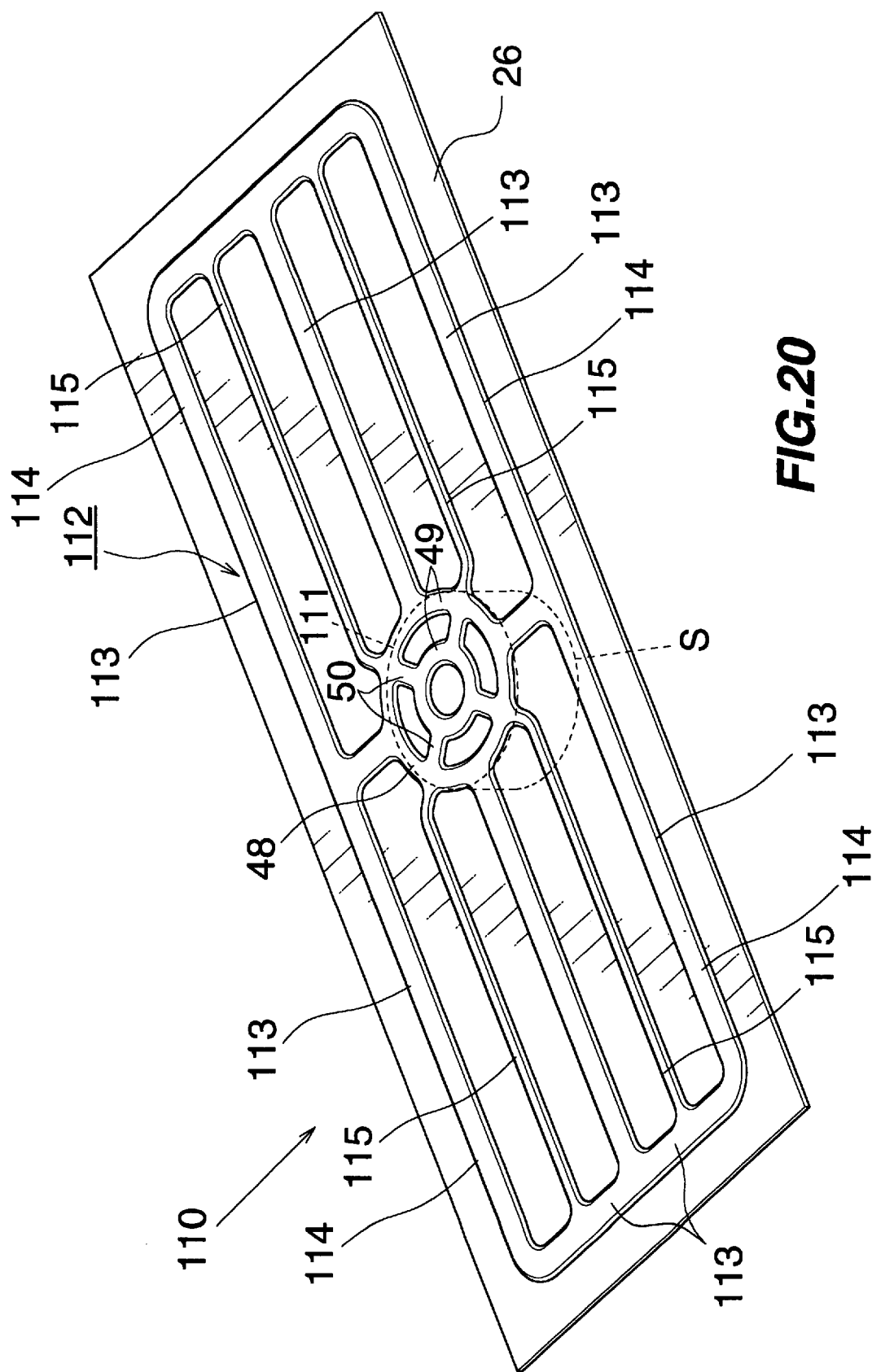
FIG. 20 is a perspective view showing another heat sink of the invention as a twelfth embodiment.

FIG. 20 shows another heat sink 110 as a twelfth embodiment of the invention. With reference to FIG. 20, the heat sink 110 of the twelfth embodiment differs from the heat sink 100 of the eleventh embodiment mainly in that a heat pipe portion 112 has a heat receiving portion 48 similar to the heat receiving portion 48 of the sixth embodiment is and provided at the center region of underside of the aluminum clad plate 26 where the MPU mount portion 111 is present, and that the heat pipe portion 112 has four rectangular looplike parts 113 at each of right and left sides of the heat receiving portion 48, each of the parts 113 communicating at opposite ends thereof with the heat receiving portion 48. The adjacent looplike parts 113 share a portion. The combination of all the looplike parts 113 has a rectangular contour. Each looplike part 113 comprises a part 114 of great channel cross sectional area, and a part 115 which is small in this area. At opposite sides of the heat receiving portion 48, the looplike part 113 is greater at one side then at the other side in channel cross sectional area.

Like the heat sink 1 of the first embodiment, the heat sink is incorporated-into a notebook personal computer 200. An MPU S1 is attached to the mount portion 111 on the underside of the sink with a heat transfer sheet (not shown) interposed therebetween. The heat produced by the MPU S1 is disposed of in the same manner as is the case with the heat sink of the eleventh embodiment described.

Figure 21:
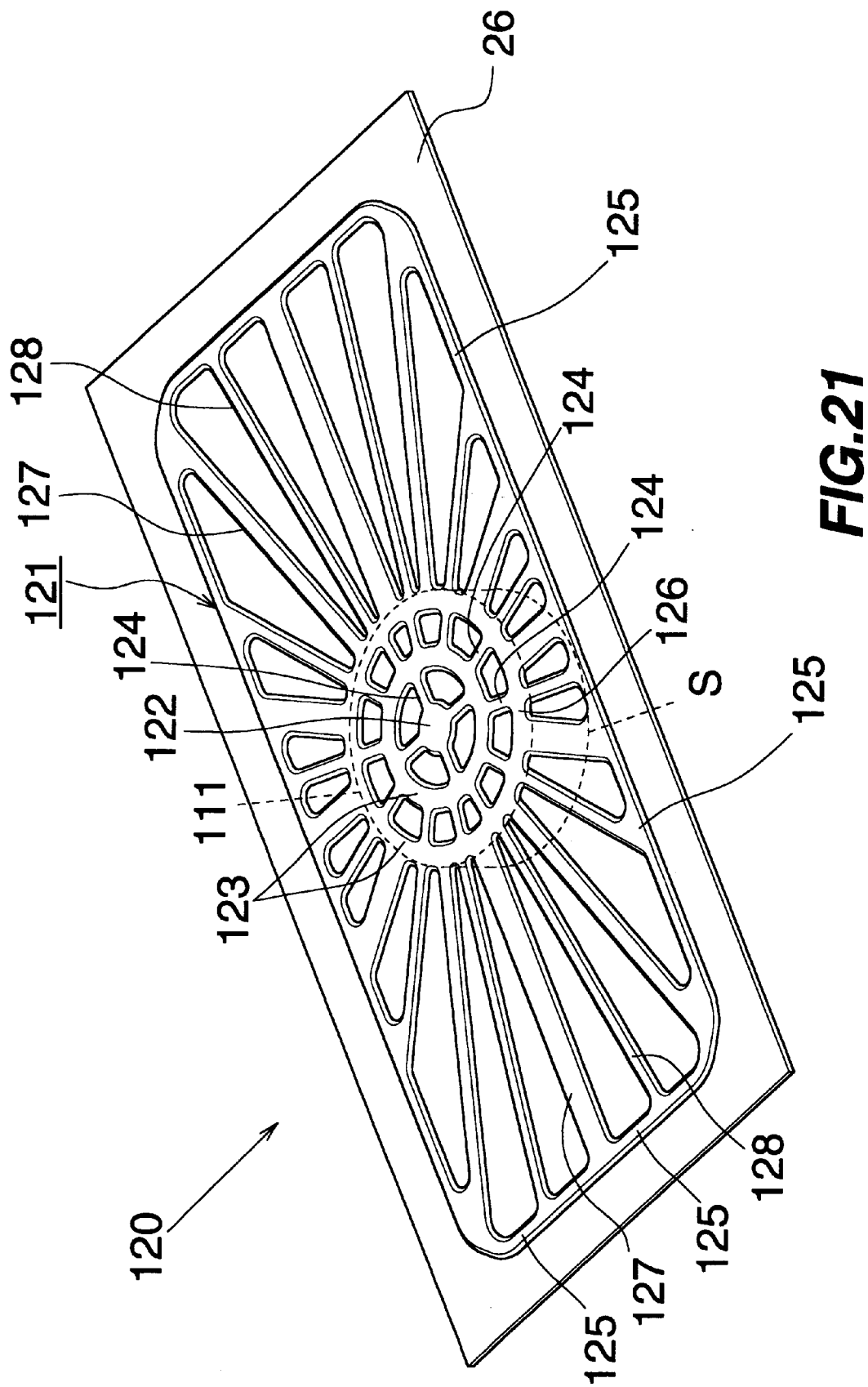
FIG. 21 is a perspective view showing another heat sink of the invention as a thirteenth embodiment.

FIG. 21 shows another-heat sink 120 as a thirteenth embodiment of the invention. With reference to FIG. 21, the heat sink 120 of this embodiment differs from the heat sink 110 of the twelfth embodiment mainly in that a heat receiving portion 126 provided at the region of a heat pipe portion 121 where the MPU mount portion 111 is present comprises a circular part 122, large and small two annular parts 123 arranged radially outwardly thereof and concentrically therewith as spaced apart, and a plurality of short straight parts 124 for holding the circular part, 122, annular part 123 and annular part 123 in communication with one another. Another main difference is that the heat pipe portion 121 has a plurality of looplike parts 125 generally triangular and communicating at opposite ends with the heat receiving portion 126. The adjacent looplike parts 125 share a portion. The combination of all the looplike parts 125 has a rectangular contour. Each looplike part 125 comprises a part 127 of great channel cross sectional area, and a part 128 which is small in this area, At opposite sides of the heat receiving portion 126, the looplike part 125 is greater at one side than at the other side in channel cross sectional area. With the present embodiment, one looplike part 125 may have a portion of increased channel cross sectional area, with another looplike part 125 adjacent thereto given a portion of reduced channel cross sectional area, and vice versa.

Like the heat sink 1 of the first embodiment, the heat sink is incorporated into a notebook personal computer 200. An MPU S1 is attached to the mount portion 111 on the underside of the sink with a heat transfer sheet (not shown) interposed therebetween. The heat produced by the MPU S1 is disposed of in the same manner an is the case with the heat sink 110 of the eleventh embodiment described.

Figure 22:
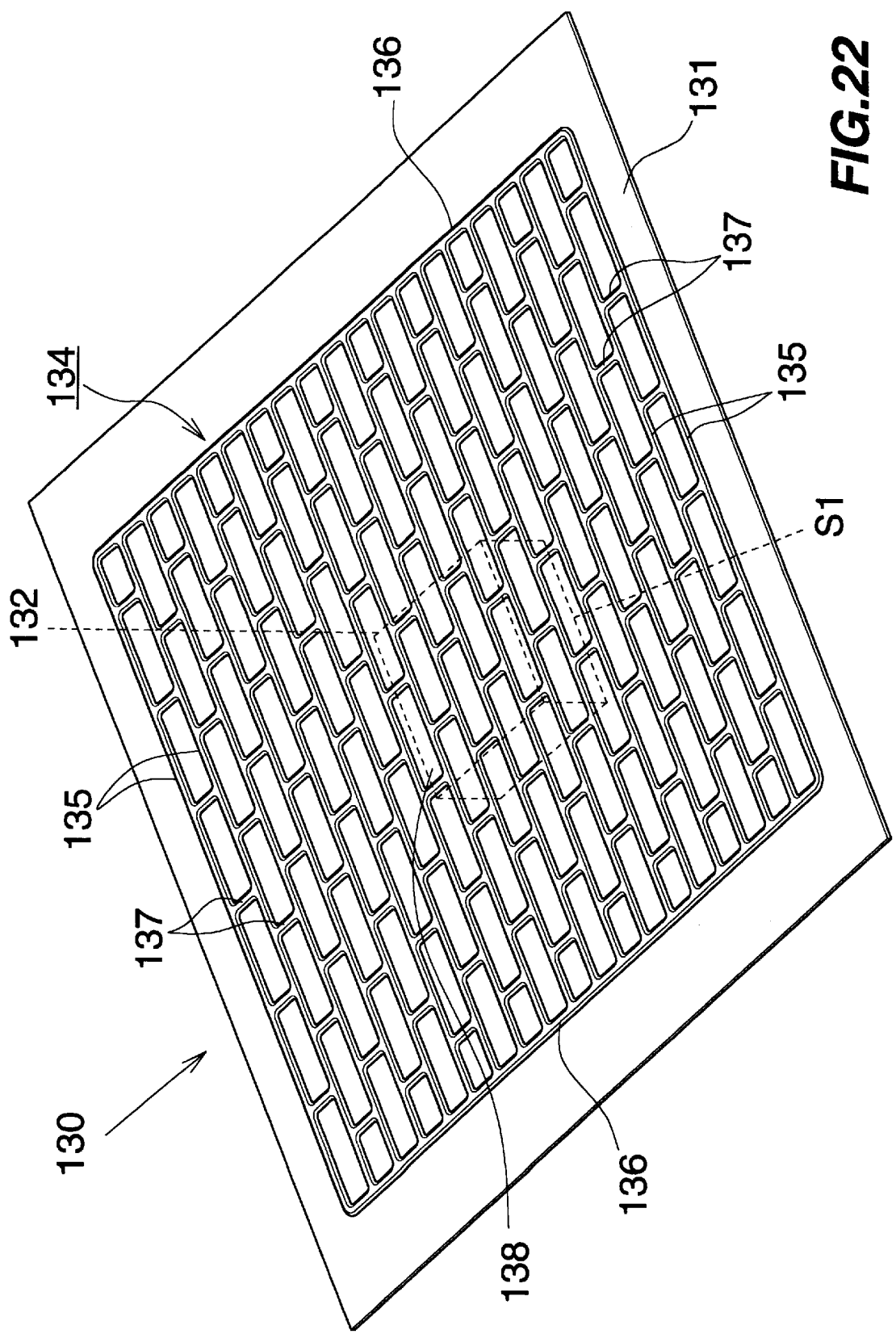
FIG. 22 is a perspective view showing another heat sink of the invention as a fourteenth embodiment.

FIG. 22 shows another heat sink 130 as a fourteenth embodiment of the invention. With reference to FIG. 22, the heat sink 130 is fabricated in the same manner an the heat sink 1 of the first embodiment, while the aluminum clad plate 131 thereof is generally square and has on the underside a center portion serving as an MPU mount portion 132. The heat pipe portion 134 comprises a plurality of straight parts 135 arranged in parallel, two long straight parts 136 for holding all the straight parts 135 in communication with one another at the respective opposite ends of the parallel arrangement, and a plurality of short straight parts 137 for holding each adjacent pair of straight parts 135 in communication with each other at lengthwise intermediate portions thereof. All the short straight parts 137 are in a staggered arrangement. Accordingly, the heat pipe portion 134 has a latticelike heat receiving portion 138 positioned at the region of the MPU mount portion 132.

Like the heat sink 1 of the first embodiment, the heat sink 130 is incorporated into a notebook personal computer 200. An MPU S1 is attached to the mount portion 132 on the underside of the sink with a heat transfer shout (not shown) interposed therebetween. The heat produced by the MPU S1 is transferred to the working liquid within the heat receiving portion 138 of the heat pipe portion 134 through the upper and lower aluminum sheets. The working liquid heated with the heat evaporates in the portion 138 into a gas, which flows through the straight parts 135, short straight parts 137 and long straight parts 136 in a direction away from the heat receiving portion 138, releasing heat through the aluminum clad plate 131 to liquefy. The working liquid thus liquefied again returns to the heat receiving portion 138 through the long straight parts 136, straight parts 135 and short straight parts 137. The portion of working liquid originally remaining in the heat pipe portion 134 other than the heat receiving portion 138 also flows toward the heat receiving portion 138 via the long straight parts 136, straight parts 135 and short straight parts 137. The phenomena and movement described are repeated to dispose of the heat generated by the MPU S1.

According to the second to fourteenth embodiments, the heat pipe portion with working liquid enclosed in its hollow portion is produced in the same manner as described with reference to the first embodiment. More specifically stated, the working liquid enclosing heat pipe portion is prepared by forming a channel in the aluminum clad plate in communication with the hollow portion and extending to an outer edge of the plate to provide an opening at the edge, injecting the liquid through the opening, and thereafter collapsing the upper aluminum sheet of the channel portion flat and bonding the sheet to the lower aluminum sheet under pressure.

With all the embodiments described, the heat sink is entirely made of an aluminum clad plate composed of two aluminum shouts and having a nonbonded portion in a required pattern. The nonbonded portion provides a heat pipe portion formed by outwardly inflating the upper aluminum sheet of the nonbonded portion to make a hollow portion and enclosing a working liquid in the hollow portion. The clad plate has a flat underside providing an MPU mount portion. However, the heat sink need not always have such a construction. The lower aluminum sheet in the nonbonded portion may be outwardly inflated to form a hollow portion to provide a heat pipe portion by enclosing the working liquid in the hollow portion, and an MPU mount portion may be formed on the underside of the clad plate. At the nonbonded portion, both the upper and lower aluminum sheets may be outwardly inflated to form a hollow portion to provide a heat pipe portion by enclosing the working liquid in this hollow portion, and an MPU mount portion may be formed on the underside of the clad plate,

EXAMPLES

Example 1

A heat sink 1 was prepared according to the first embodiment and used.

An aluminum clad plate 10 was prepared from an upper aluminum sheet 2 made of JIS A1230 and a continuous cast sheet of JIS A3003 as a lower aluminum sheet 3 by the roll bonding process. The clad plate 10 was 320 mm in length, 250 mm in width and 0.8 to 0.9 mm in thickness and formed with a hollow portion 4 in the pattern shown in FIG. 1 with a capacity of 7 cc. A working liquid comprising HFC134a was enclosed in the hollow portion 4 in an amount of 50 to 75% of the capacity of the hollow portion 4 to obtain a heat pipe portion 5. The heat receiving portion 6 measured 50 mm in the outside diameter of the outermost annular part 8, 3 mm in the radial width of each annular part 8 and also in the width of the short straight parts 9, and 3 mm in the radial interval between the adjacent annular parts 8. Bach long straight part 7 was 7 mm in width. The annular parts 8, short straight parts 9 and long straight parts 7 were 1 mm in height.

Heat was given to the MPU mount portion 13 of the heat sink 1 from the underside, and the maximum temperature difference between this portion and the portion corresponding to the outer and of the long straight part 7 was measured. Consequently, the temperature difference was about 6 deg C. regardless of the angle of inclination of the heat sink.

Example 2

A heat sink 15 was prepared according to the second embodiment and used.

An aluminum clad plate 10 was prepared from an upper aluminum sheet made of JIS A1230 and a continuous cost sheet of JIS A3003 as a lower aluminum sheet by the roll bonding process. The clad plate 10 was 320 mm in length, 250 mm in width and 0.8 to 0.9 mm in thickness and formed with a hollow portion 4 in the pattern shown in FIG. 7 with a capacity of 7 cc. A working liquid comprising HFC134a was enclosed in the hollow portion 4 in an amount of 50 to 75% of the capacity of the hollow portion 4 to obtain a heat pipe portion 5. The heat receiving portion 20 measured 36 mm in the diameter of the circular part 21, 50 mm in the outside diameter of the annular part 22, and 7 mm in the radial width of the annular part 22 and also in the width of the short straight parts 23. Each long straight part 7 was 7 mm in width. The circular part 21, annular part 22, short straight parts 23 and long straight parts 7 were 1 mm in height.

Heat was given to the MPU mount portion 13 of the heat sink 15 from the underside, and the maximum temperature difference between this portion and the portion corresponding to the outer end of the long straight part 7 was measured. Consequently, the temperature difference was about 8 deg C. regardless of the angle of inclination of the heat sink 15.

Example 3

A heat sink 65 was prepared according to the eighth embodiment and used.

An aluminum clad plate 66 was prepared from an upper aluminum sheet made of JIS A1230 and a continuous cast sheet of JIS A3003 as a lower aluminum sheet by the roll bonding process. The clad plate was 320 mm in length, 250 mm in width and 0.8 to 0.9 mm in thickness and formed with a hollow portion in the pattern shown in FIG. 15 with a capacity of 7 cc. A working liquid comprising HFC134a was enclosed in the hollow portion in an amount of 50 to 75% of the capacity of the hollow portion to obtain a heat pipe portion 70. The part 75 of small channel cross sectional area in the heat pipe portion 70 was 3.5 mm in width and 3 mm in height, and the part 74 of great area in the same portion was 7 mm in width and 3 mm in height.

Heat was given to the MPU mount portion 65 of the heat sink 65 from the underside, and the maximum temperature difference between this portion and a portion at the largest distance from the mount portion 69 was measured. Consequently, the temperature difference was about 5 deg C. regardless of the angle of inclination of the heat sink 65.

What is claimed is:

1. A heat sink for use in a portable electronic device for discharging the heat generated by an electronic component of the device, comprising:

a metal clad plate composed of two metal sheets and having a plurality of non-bonded portions formed in a radial circular pattern;

a heat pipe portion formed by outwardly raising at least one of the two metal sheets of the non-bonded portion from the other to make a hollow portion for sealing a working liquid in the hollow portion;

a mount portion for the electronic component provided on said metal clad plate at a region thereof where said heat pipe portion is partly present; and a heat receiving portion provided on said heat pipe portion at the region thereof where said mount portion is present.

2. A heat sink for use in a portable electronic device an defined in claim 1 wherein the heat pipe portion comprises a plurality of straight parts extending radially from the heat receiving portion.

* * * * *